(12) United States Patent
Fujita et al.

(10) Patent No.: US 7,139,347 B2
(45) Date of Patent: Nov. 21, 2006

(54) PARALLEL SIGNAL AUTOMATIC PHASE ADJUSTING CIRCUIT

(75) Inventors: Takehiro Fujita, Kawasaki (JP); Futoshi Izumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 615 days.

(21) Appl. No.: 10/023,123

(22) Filed: Oct. 30, 2001

(65) Prior Publication Data

US 2002/0191723 A1    Dec. 19, 2002

(30) Foreign Application Priority Data

Jun. 6, 2001  (JP)  ............................. 2001-171216

(51) Int. Cl.
    *H04L 7/00* (2006.01)
(52) U.S. Cl. .................... 375/371; 375/376; 370/516
(58) Field of Classification Search ................ 375/355, 375/371, 354, 376, 375; 713/401; 327/149, 327/156, 159, 237, 152, 153; 714/400, 700; 331/25, 1 A, 17, 2, 46, 57; 370/516
    See application file for complete search history.

(56) References Cited

U.S. PATENT DOCUMENTS

| | | | |
|---|---|---|---|
| 5,621,774 A * | 4/1997 | Ishibashi et al. ............ | 375/371 |
| 6,363,129 B1 * | 3/2002 | Agazzi ........................ | 375/355 |
| 6,526,112 B1 * | 2/2003 | Lai ............................. | 375/376 |
| 6,552,619 B1 * | 4/2003 | Shastri ........................ | 331/25 |
| 6,636,993 B1 * | 10/2003 | Koyanagi et al. ........... | 714/700 |
| 6,700,942 B1 * | 3/2004 | Lai ............................. | 375/354 |
| 6,813,724 B1 * | 11/2004 | Saito .......................... | 713/401 |
| 2002/0009169 A1 * | 1/2002 | Watanabe .................... | 375/371 |
| 2002/0044618 A1 * | 4/2002 | Buchwald et al. .......... | 375/371 |
| 2002/0048335 A1 * | 4/2002 | Saeki .......................... | 375/371 |

* cited by examiner

*Primary Examiner*—Temesghen Ghebretinsae
(74) *Attorney, Agent, or Firm*—Katten Muchin Rosenman LLP

(57) ABSTRACT

A parallel signal automatic phase adjusting circuit includes a signal generator for generating a signal having a predetermined frequency, an oscillating circuit for generating a clock signal having a frequency smaller than an inputted clock signal by the predetermined frequency, and adjusting circuits, respectively corresponding data signal channels, each adjusting the generated clock signal so as to be synchronized with the corresponding data signal, based on an arithmetic operation of trigonometric functions using both phase comparing information, derived from comparison between the corresponding data signal and the generated clock signal, and frequency information regarding the corresponding data signal, the generated clock signal and the signal from the signal generator. The circuit is useful, for example, when digital data transmitted through a large number of parallel data signal lines between data terminals, because the size of and the cost for the circuit are reduced.

21 Claims, 19 Drawing Sheets

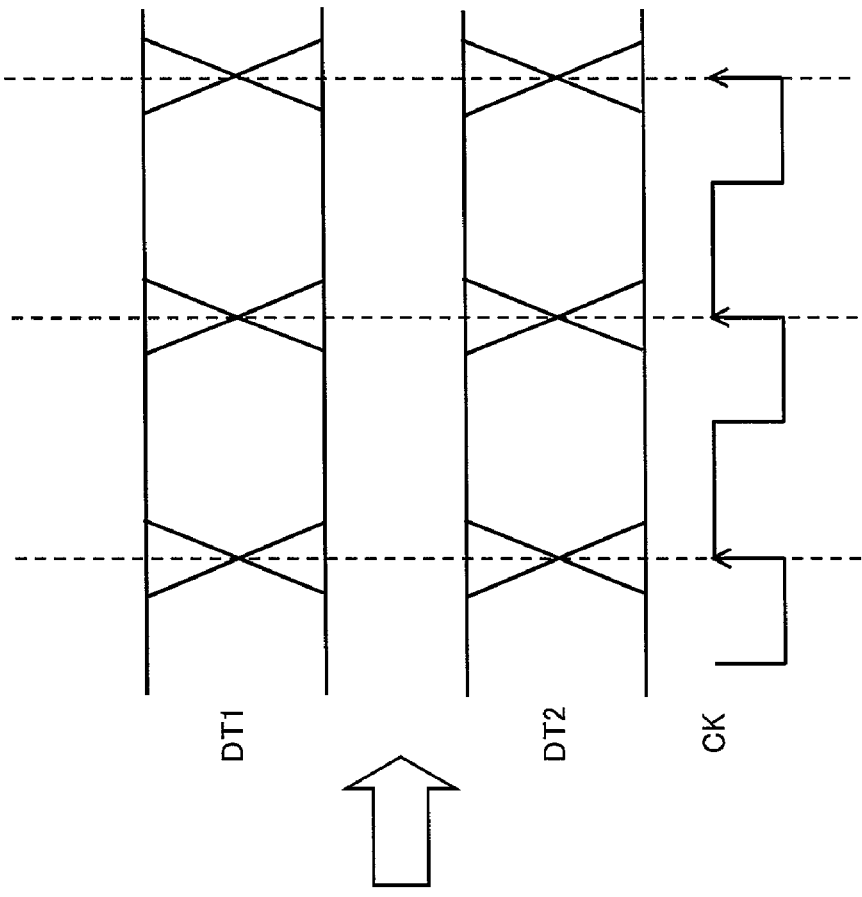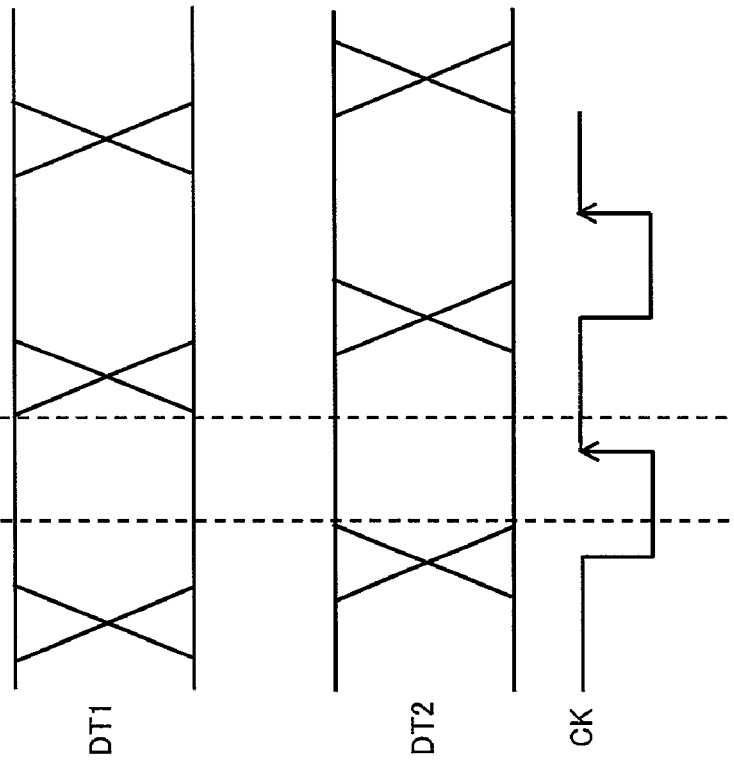

PARALLEL SIGNAL AUTOMATIC PHASE ADJUSTING CIRCUIT

BACKGROUND OF THE INVENTION

Field of the Invention

The present invention relates to a parallel signal automatic phase adjusting circuit suitable for use in a communication system in which digital data are transmitted in parallel between system components constituting the communication system.

In general, digital data are transmitted between system components as shown in FIG. 19. That is, a system component 100A placed on the side of transmission transfers data and a clock in synchronism with the data to a system component 100B on the receiving side. The system component 100B on the receiving side receives data in synchronism with the clock received from the transmission side. In this way, data transmission can be accomplished. When data are transmitted from the system component 100B to a system component 100C, similar operation is executed.

At this time, if digital data are transmitted at a relatively high transmission rate, a time period allowable to be assigned to one time slot becomes short. For this reason, a margin between signal phases (allowance in difference between signal phases upon controlling the synchronism of the signal transmission) becomes small. As a result, when a clock signal is applied to a memory cell or the like to trigger data output, the timing of clock signal can be influenced from change in temperature, a power supply voltage and so on. Also, the allowable time period in which the receiving side unit can intake the received data can be influenced from change in the temperature, the power supply voltage, and so on. Therefore, to keep reliability in data transmission becomes difficult. Furthermore, even if the data transmission system is designed while the change in the temperature, the power supply voltage and so on are taken into account, it is still necessary to absorb scattering in phase characteristic due to the deviation of the manufacturing step thereof.

That is, it is requested for the communication apparatus on the receiving side to absorb the scattering of the phase characteristic due to the change in temperature, power supply voltage, deviation of the manufacturing step and so on as described above, thereby to adjust the phase difference between the data signal and the clock signal automatically.

FIG. 20 is a diagram showing a parallel signal automatic phase adjusting circuit for automatically adjusting the phase difference between the data signal and clock signal described above. As shown in FIG. 20, the parallel signal automatic phase adjusting circuit is arranged to include N-frequency dividing circuit 101, a phase comparator 102 for generating a clock CK in synchronism with a data signal DT, a variable delay circuit 103 and a PLO (Phase Locked Oscillator) 104.

The N-frequency dividing circuit 101 is a circuit for converting the inputted clock CK into a signal having one N-th frequency. The phase comparator 102 is a component for comparing the clock CK1 outputted from the phase locked oscillator 104 provided on the downstream stage with the data signal DT in phase and outputting a signal corresponding to the phase difference. The variable delay circuit 103 is a component for effecting delay on the clock N-divided by the N-frequency dividing circuit 101 so that the frequency divided clock becomes synchronized with the data signal DT.

The PLO 104 is supplied with the clock signal made synchronism in phase with the data signal DT from the variable delay circuit 103. The PLO also generates a frequency signal having a frequency before the signal undergoes the N-frequency division into one N-th frequency, so that the frequency signal is synchronized with the clock signal in phase as a clock signal CK1. FIG. 21 is a diagram showing in more detail the arrangement of the PLO 104. As shown in FIG. 21, the PLO 104 is arranged to include a phase comparing circuit 104a, a low-pass filter 104b, an amplifier 104c, a VCO (Voltage controlled Oscillator) 104d, and an N-frequency dividing circuit 104e.

In the above arrangement, the inputted clock signal CK is subjected to the frequency-division operation in the N-frequency dividing circuit 101 and thereafter supplied to the variable delay circuit 103. The variable delay circuit 103 adjusts the phase of the clock having been subjected to the frequency-division operation in the N-frequency dividing circuit 101 in accordance with the phase difference information supplied from the phase comparator 102. The PLO 104 is supplied with a signal from the variable delay circuit 103 and generates the clock signal CK1 having a frequency identical to that of the input clock CK in synchronism with the data signal DT.

Recently, a transmission apparatus driven at a transmission speed of about 10 Gbps is put into practice. Also, a transmission apparatus driven at a transmission speed of about 10 Gbps is placed under development. When the above-described circuit for phase adjustment is arranged in an environment in which data is transmitted at about 40 Gbps, the circuit for phase adjustment cannot be implemented on a general-use printed circuit board (FR-4) due to the characteristics of the circuit elements.

That is, one time slot width of a signal having a transmission speed of about 40 Gbps is no more than 4 mm. Therefore, the phase adjustment technology is requested to be advanced for handling the signal having so high transmission speed. However, it is impossible to directly adjust the phases of the electric signals having such a high transmission speed due to the characteristics of the circuit elements.

FIG. 22 is a diagram showing an arrangement which intends to overcome the above-identified problem. In this arrangement, an input signal is subjected to a serial-parallel conversion (S/P), each of the parallel-converted signals is made into one having a low transmission rate, and then each signal is subjected to a phase adjustment in a scheme similar to that described above with reference to FIG. 20. Thereafter, these signals are again multiplexed. As shown in FIG. 22, a data signal generated in a serial manner is subjected to the serial-parallel conversion and data signals DT1 to DTn of n-channels deriving from the serial-parallel conversion is supplied to the circuit. Then, a clock in synchronism with each of the data signals DT1 to DTn is created independently.

The phase comparator 102-1 to 102-n compares in phase corresponding one of the data signals DT1 to DTn with a clock which has been frequency-divided into a signal having one N-th frequency by the N-frequency dividing circuit 101. Each of the variable delay circuits 103-1 to 103-n corrects the phase of the clock which has been frequency-divided into a signal having one N-th frequency, in accordance with the phase difference information supplied from the corresponding phase comparator 102-1 to 102-n. The PLO 104-1 to 104-n is supplied with a signal from the variable delay circuit 103-1 to 103-n. Thus, a clock signal CK1 to CKn which is in synchronism with the corresponding data signal DT1 to DTn and has a frequency identical to that of the input clock CK is created.

In the circuit shown in FIG. 22, however, if the number of parallel signal lines is increased in proportion to increase of the transmission speed and if they are not shared among the parallel data lines, it becomes necessary to prepare a number of sets of the phase comparator, the variable delay circuit and the PLO. Therefore, the size of the apparatus becomes large, and cost is increase as the number of components is increased. Furthermore, the data transmitted through the parallel signal lines can suffer from erroneous operation when the data are multiplexed.

SUMMARY OF THE INVENTION

The present invention is made in view of the above aspect. Therefore, it is an object of the present invention to provide a parallel signal automatic phase adjusting circuit which can suppress increase of the size of the circuit and hence suppress increase of cost for building the circuit, even if the circuit comes to handle a large number of parallel data signal lines.

In order to attain the above object, according to one aspect of the present invention, there is provided a parallel signal automatic phase adjusting circuit having a number of data signal channels inputted together with a clock signal and adjusting the clock signal so that the clock signal is synchronized with each of the data signals, the parallel signal automatic phase adjusting circuit including a signal generator for generating a signal having a predetermined frequency smaller than a frequency which is utilized as the data signal or the clock signal, an oscillating circuit for generating a clock signal having a frequency smaller than the inputted clock signal by the predetermined frequency generated from the signal generator, and adjusting circuits provided in correspondence to the respective data signal channels for effecting adjustment on the clock signal generated from the oscillating circuit so that the clock signal is synchronized with the corresponding data signal, based on an arithmetic operation of trigonometric functions using phase comparing information deriving from comparison between each of the data signal and the clock signal generated from the oscillating circuit and frequency information regarding the respective data signals, the clock signal generated from the oscillating circuit and the signal supplied from the signal generator.

According to a second aspect of the present invention, there is provided a parallel signal automatic phase adjusting circuit having a number of data signal channels inputted together with a clock signal and adjusting the clock signal so that the clock signal is synchronized with each of the data signals, the parallel signal automatic phase adjusting circuit including an oscillating circuit for generating a clock signal having a frequency smaller than the inputted clock signal by a predetermined frequency, and adjusting circuits provided in correspondence to the respective data signal channels for effecting adjustment on the clock signal generated from the oscillating circuit so that the clock signal is synchronized with the corresponding data signal, based on an arithmetic operation of trigonometric functions using as a parameter, phase comparing information deriving from comparison between each of the data signal and the clock signal generated from the oscillating circuit and respective frequency information.

According to a third aspect of the present invention, there is provided a parallel signal automatic phase adjusting circuit having a number of data signal channels inputted together with a clock signal and adjusting the clock signal so that the clock signal is synchronized with each of the data signals, the parallel signal automatic phase adjusting circuit including adjusting circuits provided in correspondence to the respective data signal channels for effecting adjustment on the clock signal generated from the oscillating circuit so that each clock signal is synchronized with the corresponding data signal, wherein each of the adjusting circuits is arranged to include a phase comparator for comparing the clock signal and the data signal in phase, and a trigonometric function calculating unit for effecting adjustment on the clock signal so that the clock signal is synchronized with the data signal, based on trigonometric function calculation using phase comparing information supplied from the phase comparator as a parameter.

The parallel signal automatic phase adjusting circuit according to one aspect of the present invention may be more preferably modified in such a manner that each of the adjusting circuit is arranged to include a phase comparing delay circuit which is supplied with a signal from the signal generator, compares the corresponding data signal with the clock signal as a target of adjustment and generates phase comparing information therefrom as a result of comparison together with frequency information of a signal from the signal generator, and a calculating circuit for effecting adjustment on the clock signal generated from the oscillating circuit so that the clock signal is synchronized with the corresponding data signal based on the trigonometric function calculation using the clock signal supplied from the oscillating circuit and the information supplied from the phase comparing delay circuit.

The parallel signal automatic phase adjusting circuit according to the second aspect of the present invention may be more preferably modified in such a manner that each of the adjusting circuit is arranged to include a phase comparing oscillating circuit which oscillates at a frequency identical to the predetermined frequency decreased by the oscillating circuit, compares the corresponding data signal with the clock signal as a target of adjustment, and generates phase difference information therefrom as the frequency information, and a calculating circuit for effecting adjustment on the clock signal generated from the oscillating circuit so that the clock signal is synchronized with the corresponding data signal based on the trigonometric function calculation using the clock signal supplied from the oscillating circuit and the information supplied from the phase comparing delay circuit as parameters.

The parallel signal automatic phase adjusting circuit according to the above invention may be preferably modified to include an inter-data phase adjusting circuit which is supplied with the clock signals having undergone adjustment by the respective adjusting circuits together with the corresponding data signal, and generates a plurality of kinds of data in synchronism with the timing of the most delayed clock signal.

In this case, the inter-data phase adjusting circuit may be arranged to include a clock selecting circuit for selecting a clock signal having the most delayed timing from clock signals having undergone adjustment in the respective adjusting circuits, and a data output section for generating at the same timing data signals other than the data signal corresponding to the clock signal selected by the clock selecting circuit, based on the clock signal selected by the clock selecting circuit.

The data output section is may be more preferably arranged to be composed of a number of data output units provided so as to correspond to the data signal channels respectively, each of the data output units being made up of a flop-flop circuit operable in response to the selected clock signal.

Further, the parallel signal automatic phase adjusting circuit according to the above inventions may be modified in such a manner that the inter-data phase adjusting circuit is arranged to include a clock selecting circuit for selecting a clock signal having the most delayed timing from clock signals having undergone adjustment in the respective adjusting circuits, and for generating a data signal corresponding to the selected clock signal, a data output section for generating all of the data signals at the same timing based on the clock signal selected by the clock selecting circuit, and a register circuit section capable of compensating for a phase deviation exceeding one time slot amount based on bit information of respective data signals.

In this case, the register circuit section maybe arranged to include a plurality of shift registers connected in a cascade fashion so as to correspond to respective data signal channels, each of the shift registers being capable of holding data of corresponding data signal channel, and selectors provided so as to correspond to respective data signal channels so that each selector is supplied with an output signal from the shift registers in the corresponding data signal channel, all of the selectors being capable of outputting respective data stream at the same timing in response to a select signal useful for extracting data pieces having the same timing.

Furthermore, each of the adjusting circuits may be arranged to include a temperature sensor for compensating for the temperature dependability of the phase comparing information.

BRIEF DESCRIPTION OF THE DRAWINGS

FIG. 10($b$) is a timing chart for explaining an operation of the first modification of the first embodiment shown in FIG. 10($a$);

FIGS. 12($a$) and 12($b$) are diagrams for explaining the difference between the operations of the parallel signal automatic phase adjusting circuits as the first modification and the second modification of the first embodiment;

DESCRIPTION OF THE PREFERRED EMBODIMENTS

Embodiments of the present invention will be hereinafter described with reference to drawings.

(a1) Description of First Embodiment

Figure 1:
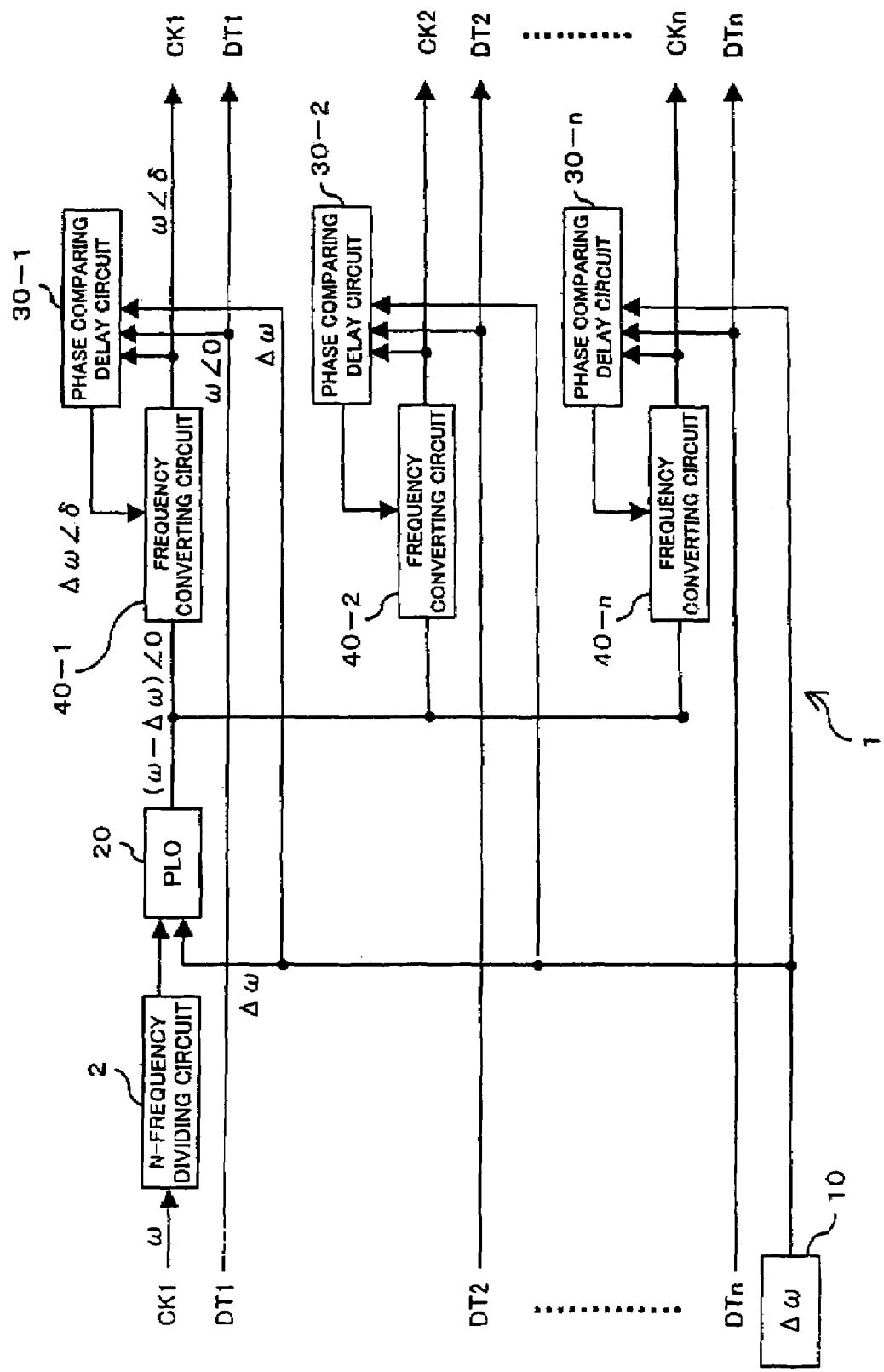
FIG. 1 is a block diagram showing a parallel signal automatic phase adjusting circuit according to a first embodiment of the present invention.
Figure 19:
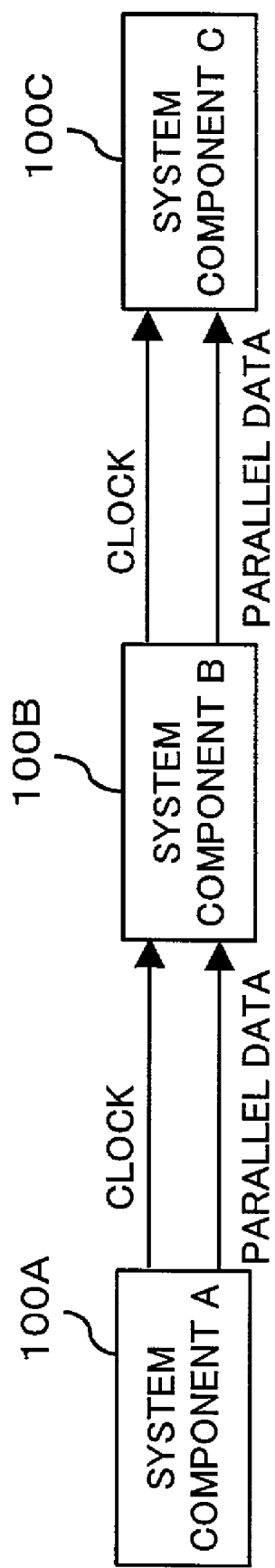
FIG. 19 is a diagram for explaining a system in which digital signals are transmitted and received in parallel between system components.

FIG. 1 is a block diagram showing a parallel signal automatic phase adjusting circuit as a first embodiment of the present invention. The parallel signal automatic phase adjusting circuit shown in FIG. 1 can be applied to a transmission system as shown in FIG. 19 in which plurality of digital data signals are transmitted in parallel between the system components 100A to 100C together with a clock signal.

As shown in FIG. 1, the parallel signal automatic phase adjusting circuit 1 is supplied with a plurality of channels of data signals DT1 to DTn as a set of parallel signals together with a clock signal CK1. When the clock signal CK1 is supplied to the parallel signal automatic phase adjusting circuit, this clock signal is subjected to an adjustment so that the clock signal is synchronized with each of the data signals DT1 to DTn. To this end, the parallel signal automatic phase adjusting circuit 1 is arranged to include an N-frequency dividing circuit 2, Δω oscillator 10 and a PLO (Phase Locked Oscillator) 20. Further, the parallel signal automatic phase adjusting circuit is arranged to include phase comparing delay circuits 30-1 to 30-$n$ and frequency converting circuits 40-1 to 40-$n$ so that each set of phase comparing delay circuit 30-1 to 30-$n$ and frequency converting circuit 40-1 to 40-*n* is assigned to each of the processing channels of the data signals DT1 to DTn.

In this case, the N-frequency dividing circuit 2 effects N-frequency dividing on the inputted clock signal CK so that the PLO becomes free from dependability when the POL is operated. The frequency dependability will be more fully described later on. Owing to the N-frequency dividing circuit 2, even if the clock signal has a high frequency, the PLO 20 can be operated with stability.

The $\Delta\omega$ oscillator 10 as a signal generator is a low frequency oscillator for generating a signal having a predetermined frequency of $\Delta\omega$ which is smaller than the frequency of the data signals DT1 to DTn or the frequency $\omega$ of the clock signal CK1. The signal generated from the $\Delta\omega$ oscillator 10 is supplied to the PLO 20 and the phase comparing delay circuits 30-1 to 30-*n*.

The PLO 20 as an oscillating circuit is a circuit for generating a clock signal with a fixed phase having a frequency of $(\omega-\Delta\omega)$ which derives from subtracting $\Delta\omega$ (frequency at which the $\Delta\omega$ oscillator 10 oscillates) from the frequency $\omega$, which is of the clock signal inputted to the N-frequency dividing circuit 2. The arrangement of the PLO 20 is more fully illustrated in FIG. 2. If $\angle 0$ is taken as the fixed phase in the PLO 20, then the clock signal outputted from the PLO 20 is denoted as "$(\omega-\Delta\omega)\angle 0$" in the figure as a signal having a frequency of $(\omega-\Delta\omega)$ and a phase of $\angle 0$.

The above-described predetermined frequency $\Delta\omega$ may be set to a frequency of about several kilohertz to one megahertz.

Figure 2:
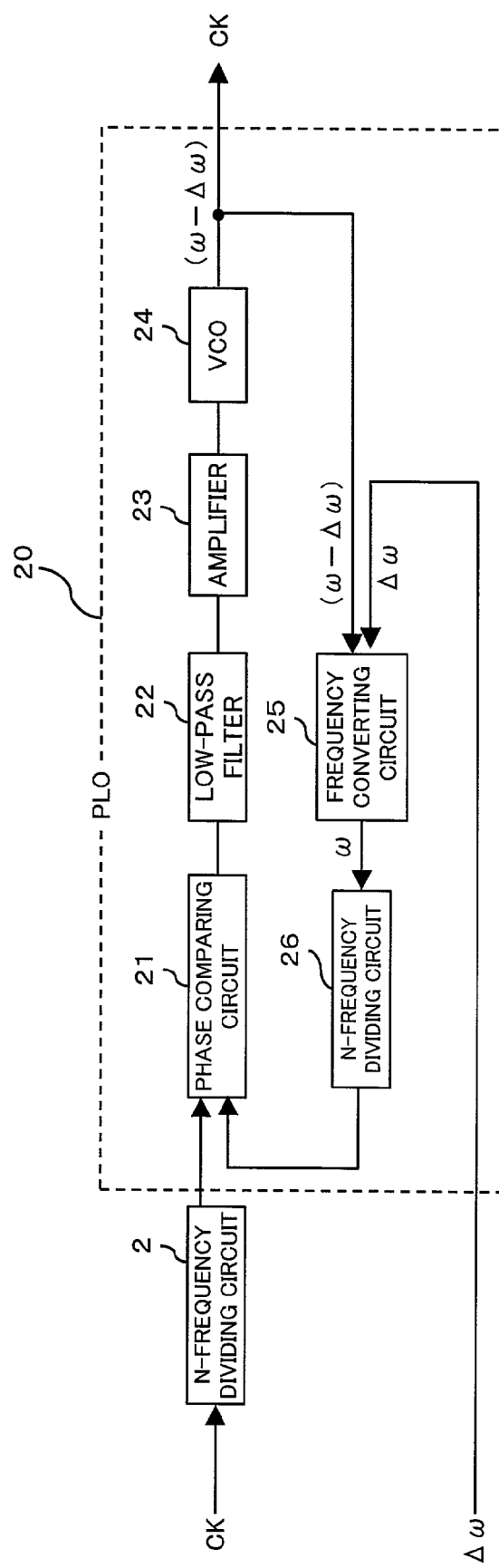
FIG. 2 is a block diagram showing an arrangement of a PLO in the first embodiment of the present invention.

As shown in FIG. 2, the PLO 20 is arranged to include a phase comparing circuit 21, a low-pass filter 22, an amplifier 23, a VCO 24, a frequency converting circuit 25 and N-frequency dividing circuit 26.

The phase comparing circuit 21 is a circuit for comparing the clock signal supplied from the N-frequency dividing circuit 26 and the clock signal supplied from the N-frequency dividing circuit 2 in phase, and also generates a voltage signal in accordance with the phase difference determined by the comparison. The phase comparing circuit 21 can be arranged in a manner similar to that of the phase comparing circuit 104*a* provided in the PLO 104 shown in FIG. 21.

The low-pass filter 22 is a filter which removes a high-frequency component from the voltage signal as a result of phase comparison effected in the phase comparing circuit 21 and generates the resultant signal to the amplifier 23. The amplifier 23 is supplied with a voltage signal which has passed through the low-pass filter 22, and also generates an amplified signal of the voltage signal to the VCO 24 for use as a control voltage signal.

That is, the voltage signal as a result of the phase comparison supplied from the phase comparing circuit 21 is applied to the VCO 24 through the low-pass filter 22 having a relax time. The amplification factor of the amplifier 23 is settled in such a manner that when the phase comparing circuit 21 detects that the phases of the signals under comparison are completely coincident to each other, the VCO 24 generates a clock signal having a frequency of $(\omega-\Delta\omega)$ which is decreased by $\Delta\omega$ with respect to the frequency $\omega$, which is N-times frequency of the clock signal supplied from the N-frequency dividing circuit 2.

The frequency converting circuit 25 is supplied with a clock signal outputted from the VCO 24 and a signal having a frequency of $\Delta\omega$ from the $\Delta\omega$ oscillator 10, and generates a signal having a frequency of $\omega$ corresponding to the clock signal before frequency-divided by the N-frequency dividing circuit 2. This operation can be effected by executing a signal processing which is equivalent to an arithmetic operation of the following Equation (1). The frequency converting circuit 25 can be constructed in a manner similar to that of the frequency converting circuits 40-1 to 40-*n* which will be more fully described later on.

$$Vout = V0\sin(\omega - \Delta\omega)t \cdot \cos(\Delta\omega t) + V0\cos(\omega - \Delta\omega) \cdot \sin(\Delta\omega t) \quad (1)$$
$$= V0\sin[(\omega - \Delta\omega)t + \Delta\omega t]$$
$$= V0\sin\omega t$$

Further, the N-frequency dividing circuit 26 is a circuit for dividing the frequency of the signal, which has been frequency converted into one having a frequency of $\omega$ by the frequency converting circuit 25, into a signal having one N-th frequency, whereby the above-described phase comparing circuit 21 can effect phase comparison between signals supplied from the N-frequency dividing circuit 2 and the N-frequency dividing circuit 26.

The phase comparing delay circuit (phase comparator) 30-1 to 30-*n* provided so as to correspond to each of the data signal channels DT1 to DTn is a circuit for comparing in phase the data signal DT1 to DTn and the clock signal outputted from the frequency converting circuit 40-1 to 40-*n* which will be described later on. The phase comparing delay circuit 30-1 to 30-*n* then outputs a phase difference $\delta$ as a result of phase comparison together with the frequency information generated from the $\Delta\omega$ oscillator 10. In more concretely, the phase comparing delay circuit 30-1 to 30-*n* synthesizes the signal having the predetermined frequency of $\Delta\omega$ generated from the $\Delta\omega$ oscillator 10 and the phase difference $\delta$ as a result of phase comparison together, and generates the synthesized signal to the frequency converting circuit 40-1 to 40-*n*.

Figure 3:
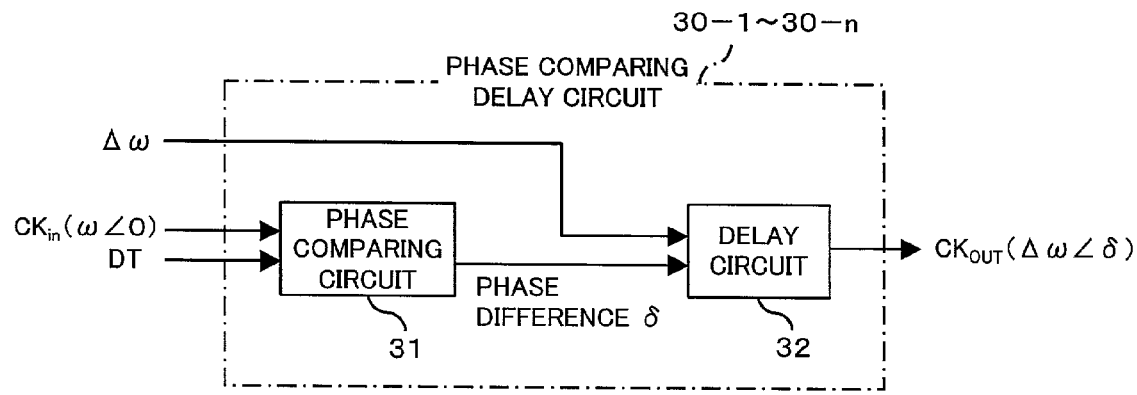
FIG. 3 is a block diagram showing a phase comparing delay circuit in the first embodiment of the present invention.
Figure 4:
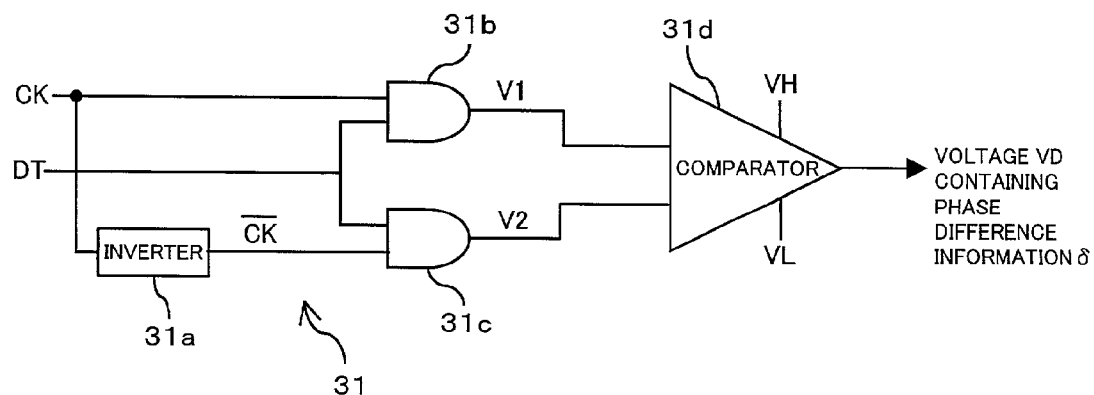
FIG. 4 is a diagram showing a phase comparing circuit in the phase comparing delay circuit in the first embodiment.
Figure 6:
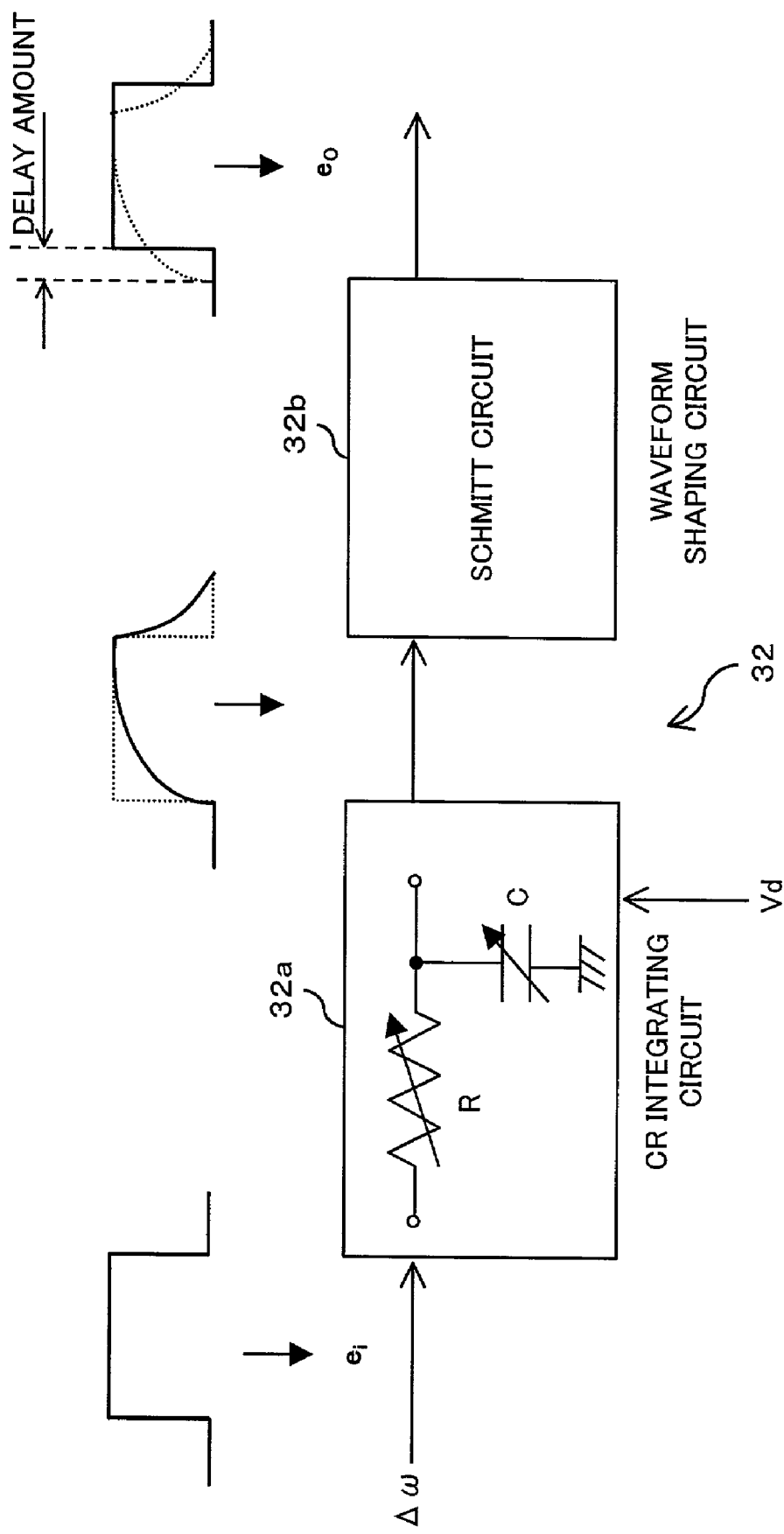
FIG. 6 is a block diagram showing a delay circuit in the phase comparing delay circuit in the first embodiment.

FIG. 3 is a diagram showing in detail an example of the arrangement of the phase comparing delay circuit 30-1 to 30-*n*. As shown in FIG. 3, the phase comparing delay circuit 30-1 to 30-*n* is arranged to include a phase comparing circuit 31 and a delay circuit 32. The phase comparing circuit 31 is arranged as shown in FIG. 4, for example. The delay circuit 32 is arranged as shown in FIG. 6, for example. In these figures, the signal having a frequency of $\Delta\omega$ and containing phase information $\delta$, which is generated from the phase comparing delay circuit 30-1 to 30-*n*, is expressed as "$\Delta\omega\angle\delta$".

As shown in FIG. 4, the phase comparing circuit 31 is arranged to include an inverting circuit 31*a*, AND circuits 31*b*, 31*c*, and a comparator 31*d*, whereby the phase comparing circuit 31 can compare the phase of the clock signal CKin ($\omega\angle 0$) outputted from the frequency converting circuit 40-1 to 40-*n* which will be described later and the phase of the corresponding data signal DT1 to DTn with each other. Then, the phase comparing circuit 31 generates a voltage signal corresponding to the phase difference as the result of comparison.

Figure 5:
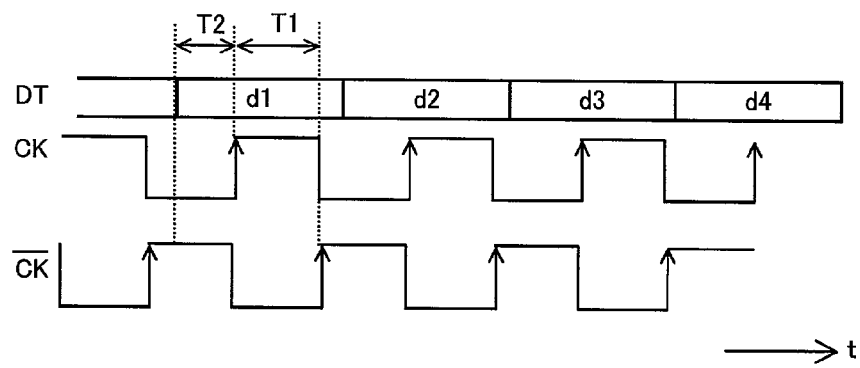
FIG. 5 is a timing chart for explaining an operation of the phase comparing delay circuit in the first embodiment.

As for example shown in FIG. 5, the AND circuit 31*b* is supplied with the data signal DT and the clock signal CK at a time. When a data signal d1 is inputted and the clock signal takes a high level state as for example in a time period T1, the output signal V1 takes a high level state. Conversely, when the clock signal takes a low level state as for example in a time period T2, the output signal V1 takes a low level state.

The AND circuit 31*c* operates in a similar manner. That is, as for example shown in FIG. 5, the AND circuit 31*c* is supplied with the data signal DT and an inverted clock signal (CK bar) at a time. When the data signal d1 is inputted and the inverted clock signal takes a high level state as for example in a time period T2, the output signal V2 takes a high level state. Conversely, when the inverting clock signal takes a low level state as for example in a time period T1, the output signal V2 takes a low level state.

The comparator 31d is a circuit which compares the magnitudes of the output signals V1 and V2 supplied from the above-described couple of AND circuits 31b and 31c with each other, and generates a signal corresponding to the result of comparison in terms of magnitudes thereof. For example, if the value of the output signal V1 is larger than the value of the output signal V2, the comparator 31d outputs a high level signal VH. Conversely, if the value of the output signal V2 is larger than the value of the output signal V1, the comparator 31d outputs a low level signal VL. In this way, the comparator 31d can generates a signal Vd which indicates a deviation in phase between the clock signal CK and the data signal DT.

The delay circuit 32 constituting the phase comparing delay circuit 30-1 to 30-n is a circuit which is supplied with a signal having a frequency of $\Delta\omega$ from the $\Delta\omega$ oscillator 10 together with the phase difference information $\delta$ from the phase comparing circuit 31, and generates the signal having the frequency of $\Delta\omega$ as to be delayed by the phase $\delta$. The delay circuit 32 can be arranged to include a CR integrating circuit 32a and a Schmitt circuit 32b, as for example shown in FIG. 6.

The integrating circuit 32a is arranged to variably adjust the circuit characteristic based on the voltage signal Vd which is supplied from the phase comparing circuit 31 and indicates the phase difference information $\delta$. Owing to this arrangement, integration processing can be carried out at an integrating coefficient corresponding to the phase difference information. The Schmitt circuit 32b is a circuit which effects a waveform shaping processing on a signal of which waveform loses its sharpness due to the processing effected by the CR integrating circuit 32a so that the rising time of the pulse is delayed by a predetermined time.

Meanwhile, when the above-described PLO 20 and the phase comparing delay circuit 30-1 to 30-n carry out their processing, the signal having the frequency of $\Delta\omega$ from the $\Delta\omega$ oscillator 10 is commonly utilized as a frequency oscillation source. Therefore, the PLO 20 and the phase comparing delay circuit 30-1 to 30-n can always be supplied with the same value of frequency, $\Delta\omega$. Accordingly, the phase compensating function can be more reliably maintained.

Each of the frequency converting circuits 40-1 to 40-n as an arithmetic operation circuit adjusts the clock signal from the PLO 20 so as to be synchronized with the corresponding data signal and outputs therefrom, based on an arithmetic operation of trigonometric functions using the clock signal ($\omega-\Delta\omega$)$\angle 0$ from the PLO 20 and a phase comparing result signal $\Delta\omega\angle\delta$ from the phase comparing delay circuit 30-1 to 30-n.

In more concretely, the frequency converting circuit 40-1 to 40-n is supplied with the clock signal ($\omega-\Delta\omega$)$\angle 0$ from the PLO 20 and a phase comparing result signal $\Delta\omega\angle\delta$ from the phase comparing delay circuit 30-1 to 30-n, and carries out an arithmetic operation using the trigonometric functions expressed by the following Equation (2),whereby the clock signal is subjected to an adjustment in accordance with the phase difference of the clock signal with respect to the data signal.

That is, if $\delta$ is taken as the phase difference between the clock signal and the data signal, and the pulse waveform of the clock signal is regarded as a sine wave, the clock signal can be expressed by the following Equation (2). However, Equation (2) can be further transformed into Equation (3).

$$VCk = V0\sin(\omega t + \delta) \qquad (2)$$

$$\begin{aligned} VCk &= V0\sin(\omega t + \delta) \\ &= V0\sin[(\omega - \Delta\omega)t + \Delta\omega t + \delta] \\ &= V0\sin(\omega - \Delta\omega)t \cdot \cos(\Delta\omega t + \delta) + V0\cos(\omega - \Delta\omega)t \cdot \\ &\quad \sin(\Delta\omega t + \delta) \end{aligned} \qquad (3)$$

Figure 7:
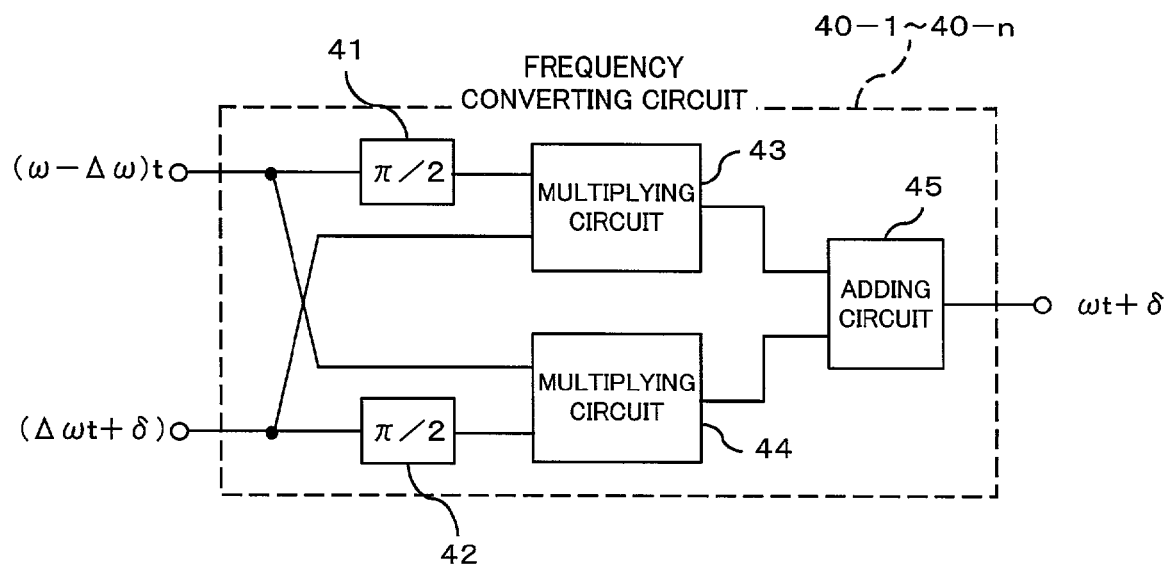
FIG. 7 is a block diagram showing a frequency converting circuit employed in the parallel signal automatic phase adjusting circuit as the first embodiment shown in FIG. 1.

In more concretely, as shown in FIG. 7, the frequency converting circuit 40-1 to 40-n regards the clock signal ($\omega-\Delta\omega$)$\angle 0$ and a phase comparing result signal $\Delta\omega\angle\delta$ as sine wave functions as expressed in the following Equations (4) and (5), respectively, and frequency converting processing is carried out. That is, a processing defined by the following Equations (4) and (5) is made equivalent to the above-described arithmetic operation of Equation (3), whereby the clock signal having undergone the phase adjustment can be expressed by trigonometric functions as a function of the clock signal in which the phase difference $\delta$ serves as a constant independent of time t.

$$(\omega-\Delta\omega)\angle 0 = V0 \sin(\omega-\Delta\omega)t \qquad (4)$$

$$\Delta\omega\angle\delta = \sin(\Delta\omega t + \delta) \qquad (5)$$

In this case, each of the frequency converting circuits 40-1 to 40-n is arranged to include a phase shift units ($\pi/2$) 41, 42, multiplication circuits 43 and 44 and an adding circuit 45. The phase shift unit 41 and the multiplication circuit 43 are units for calculating the second term of the right side of the above Equation (3), and the phase shift unit 42 and the multiplying circuit 44 are units for calculating the first term of the right side of the same Equation (3). Accordingly, the adding circuit 45, which adds the results of multiplication of the above multiplying circuits 43 and 44 together, can output a value equivalent to the left side of the Equation (3).

Therefore, the frequency converting circuit 40-1 to 40-n functions/as a calculating circuit for effecting adjustment on the clock signal generated from the PLO 20 so that the clock signal is synchronized with the corresponding data signal, based on the trigonometric function calculation using the clock signal supplied from the PLO 20 and the information supplied from the phase comparing delay circuit 30-1 to 30-n.

Further, a pair of phase comparing delay circuit 30-t and the frequency converting circuit 40-t (t; 1 to n), which is provided so as to correspond to any of the channels of the data signals DTt, functions as an adjusting circuit for effecting adjustment on the clock signal generated from the PLO 20 so that the clock signal is synchronized with the corresponding data signal, based on an arithmetic operation of trigonometric functions using as a parameter, phase comparing information deriving from comparison between each of the data signal and the clock signal generated from the PLO 20, frequency information regarding the clock signal and the data signals, and the frequency information $\Delta\omega$ of the decreased frequency.

Accordingly, if the parallel signal automatic phase adjusting circuit 1 according to the first embodiment of the present invention having the above arrangement is applied to the transmission system composed of the system components 100A to 100C shown in FIG. 19, the parallel signal automatic phase adjusting circuit 1 functions as follows. That is, when a set of parallel signals are transmitted between the system components 100A to 100C, a side of component, which receives a set of data signals in a parallel fashion together with the clock signal, can compensate for the phase difference between the clock signal and corresponding one of the data signals DT1 to DTn at the preceding stage where the data are supplied in synchronism with the clock signal.

The PLO 20 is supplied with a clock signal, which is frequency-divided into a signal having one N-th frequency by the N-frequency circuit 2, and the signal having the frequency of $\Delta\omega$ from the $\Delta\omega$ oscillator 10. Then the PLO 20 compares the clock signal and the signal having the frequency of $\Delta\omega$ from the $\Delta\omega$ oscillator 10 with each other and generates a signal (clock signal) having a frequency of $\omega-\Delta\omega$ containing phase information as the result of comparison. In other words, the PLO 20 oscillates by generating the clock signal at the frequency of $(\omega-\Delta\omega)$ which derives from subtracting the predetermined frequency $\Delta\omega$ from the frequency of the inputted clock signal, $\omega$.

The signal generated from the PLO 20 is supplied to the frequency converting circuit 40-1 to 40-n of each data signal channel. Each of the frequency converting circuits 40-1 to 40-n is supplied with the signal from the above-described PLO 20 and a signal having the frequency of $\Delta\omega$ containing the phase difference information $\delta$ indicative of the deviation in phase of the clock signal with respect to the data signal generated from the corresponding phase comparing delay circuit 30-1 to 30-n. Thus, the frequency converting circuit 40-1 to 40-n carries out a signal processing equivalent to the above-described Equation (3) based on the supplied signals.

Owing to the signal processing carried out by the frequency converting circuit 40-1 to 40-n it becomes possible to obtain a clock signal CK1 to CKn in which the phase difference between each data signal DT1 to DTn and the clock signal is compensated for. Meanwhile, the frequency $\Delta\omega$ is set to several kHz to 1 Mhz, which is sufficiently smaller than the frequency $\omega$ at which the system is driven. Thus, the phase difference $\delta$ can be well controlled with precision.

As described above, when the system component on the side of reception shown in FIG. 19 is supplied with the clock signal CK1 to CKn having undergone compensation in correspondence with each of the data signals DT1 to DTn as a set of parallel signals, a signal processing unit, which is provided on the downstream side, although not shown, intakes each of the data signals DT1 to DTn as a set of parallel signals in synchronism with the clock signal having the phase difference compensated for.

As described above, according to the parallel signal automatic phase adjusting circuit 1 of the first embodiment of the present invention, the PLO 20 is shared by each of the data signal channels. Therefore, unlike the aforesaid case shown in FIG. 22, the PLO circuit need not be provided for each data signal channel, with the result that the size of the system in which the parallel data signals are handled can be made small, the number of components constituting the system can be decreased, which facts lead to a merit of cost reduction. In particular, when it is requested to build a circuit in which the number of parallel data lines is increased, the size of the system can be made small, and cost increase can be suppressed.

That is, in the circuit 1 as the first embodiment, a single unit of PLO 20 is shared by a number of data signal channels, and the phase comparing delay circuit 30-1 to 30-n and the frequency converting circuit 40-1 to 40-n, which are provided for each of the data signal channels, are sufficiently small-sized. Therefore, the system can be also small-sized and at the same time, cost can be reduced owing to the reduction of the number of components.

Furthermore, in the circuit 1 as the first embodiment, the signal generated from the $\Delta\omega$ oscillator 10 is supplied to the PLO 20 and the respective phase comparing delay circuits 30-1 to 30-n in common. Therefore, it is expected that the PLO 20 and the respective phase comparing delay circuits 30-1 to 30-n can always create a signal having the same value of $\Delta\omega$ component. Accordingly, the phase compensating function can be more reliably exerted.

(a2) Description of First Modification of First Embodiment

Figure 10A:
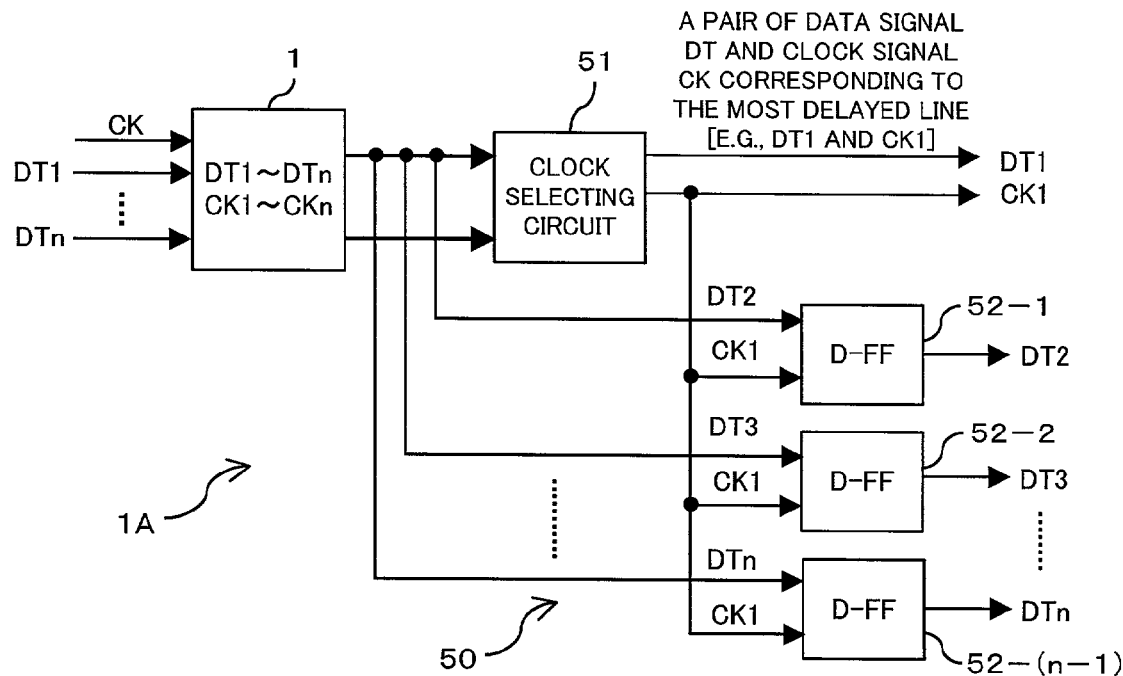
FIG. 10($a$) is a block diagram showing a parallel signal automatic phase adjusting circuit according to a first modification of the first embodiment of the present invention.

FIG. 10(a) is a block diagram showing an arrangement of a parallel signal automatic phase adjusting circuit as a first modification of the first embodiment of the present invention. The parallel signal automatic phase adjusting circuit 1A shown in FIG. 10(a) can be applied to optical relay regenerators (reg) 302 and 303 employed in an optical communication system shown in FIG. 8, for example.

Figure 8:
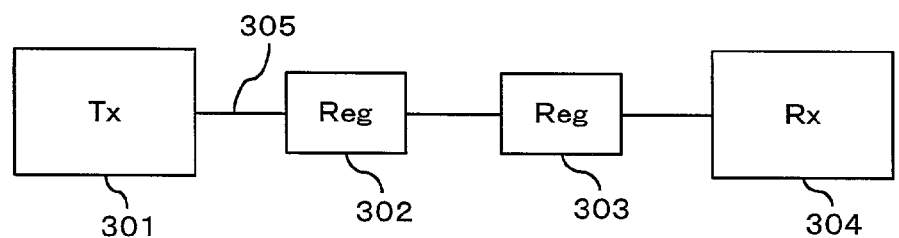
FIG. 8 is a block diagram schematically showing an optical communication system to which a first modification of the first embodiment according to the resent invention can be applied.

As shown in FIG. 8, the optical communication system is arranged to include a transmitting side component (Tx) 301 and the receiving side component (Rx) 304 connected to each other through optical fiber cables 305 and the optical relay regenerators 302 and 303. Thus, an optical signal can be transmitted from the transmitting side component 301 to the receiving side component 304.

Figure 9:
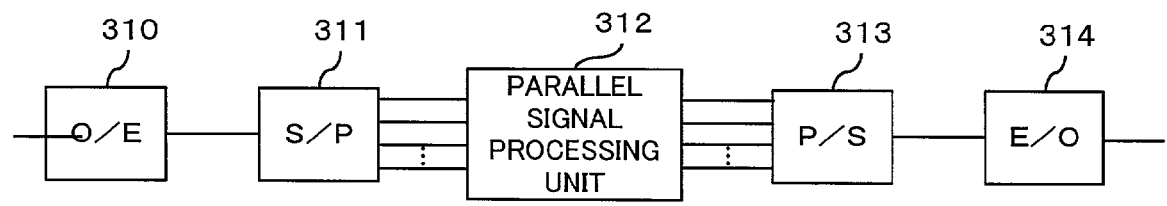
FIG. 9 is a block diagram schematically showing a main portion of an optical relay regenerator employed in the optical communication system shown in FIG. 8.

The optical relay regenerator 302 and 303 is arranged to include an O/E (Optical/Electric) converting unit 310, a serial/parallel converting unit (S/P) 311, a parallel signal processing unit 312, a parallel/serial converting unit (P/S) 313, and an E/O (Electric/Optical) converting unit 314, as for example shown in FIG. 9.

The O/E converting unit 310 is a unit which is supplied with a transmitted optical signal through the optical fiber 305 and converts the optical signal into an electric signal. The serial/parallel converting unit 311 is a unit for converting the serial electric signal supplied from the O/E converting unit 310 into a set of parallel signals.

Further, the parallel signal processing unit 312 is a unit for subjecting a desired signal processing on the set of parallel signals supplied from the serial/parallel converting unit 311. The parallel signal automatic phase adjusting circuit 1 and an inter-data phase adjusting circuit 50 (see FIG. 10(a)) according to the present embodiment can be applied to the parallel signal processing unit 312.

The parallel/serial converting unit 313 is a unit for converting the set of parallel signals having undergone the desired signal processing in the parallel signal processing unit 312, into a serial signal again. The E/O converting unit 314 is a unit for converting the serial electric signal supplied from the parallel/serial converting unit 313 into an optical signal. The converted optical signal is transmitted through the optical fiber 305 of the receiving side component 304.

As described above, the parallel signal automatic phase adjusting circuit 1A according to the first modification of the first embodiment is arranged to include the inter-data phase adjusting circuit 50 which is connected to the circuit 1 as the above-described first embodiment at the downstream side thereof. With this arrangement, data signals of the respective parallel lines can be adjusted in phase so that all of the data signals have the same phase, as well as the clock signal and data signal paired with the corresponding clock signal are adjusted in phase. Accordingly, the parallel/serial converting unit 313 provided on the downstream side of the system can convert the set of parallel signals into the serial one with ease.

The inter-data phase adjusting circuit 50 is supplied with a clock signal having been adjusted in phase and a data signal corresponding to the clock signal together, from each frequency converting circuit 40-1 to 40-n (see FIG. 1) of the parallel signal automatic phase adjusting circuit 1. Further, the inter-data phase adjusting circuit 50 generates data signals DT1 to DTn in synchronism with the timing of the most delayed clock signal.

In more concretely, the inter-data phase adjusting circuit 50 is arranged so that this circuit generates all of the data signals in synchronism with the most delayed clock signal of the clock signals CK1 to CK-n which have been subjected to the phase compensation in respective frequency converting circuits 40-1 to 40-n. With this arrangement, respective data signals are outputted therefrom with a phase synchronized among the data signals. Accordingly, the parallel/serial converting unit 313 provided on the downstream side of the system can convert the set of parallel signals into the serial one with ease.

The inter-data phase adjusting circuit 50 is arranged to include a clock selecting circuit 51 and a data outputting section composed of N pieces of D flip-flop (D-FF) 52-1 to 52-(n-1).

The clock selecting circuit 51 selects the most delayed clock signal from the inputted N clock signals, and also generates a data signal corresponding to the selected clock signal. Each of the D flip-flops (D-FF) 52-1 to 52-(n-1) is a circuit for outputting a data signal other than the data signal corresponding to the selected clock signal, in accordance with the timing of the clock signal resulting from the selection of the clock selecting circuit 51.

In other words, the D flip-flop 52-1 to 52-(n-1) is provided on each data signal channel, and each D flip-flop 52-1 to 52-(n-1) is operable in response to the clock signal selected by the clock selecting circuit 51.

With the above arrangement, in the clock signal selecting circuit 51 of the inter-data phase adjusting circuit 50 of the first modification of the first embodiment, a data signal and a clock signal having the most delayed phase are selected and outputted therefrom. In the case shown in FIG. 10(a), it is assumed that a pair of the data signal DT1 and the clock signal CK1 is one having the most delayed phase.

Data signals DT2 to DTn other than the data signal DT1 are temporarily held in the D flip-flop 52-1 to 52-n), respectively, and outputted therefrom in synchronism with the clock signal CK1 selected by the clock selecting circuit 51. The data signal corresponding to the most delayed clock signal is directly outputted without being held in any of the D flip-flops 52-1 to 52-(n-1). In this way, a set of data signals each having the same phase can be obtained.

Figure 10B:
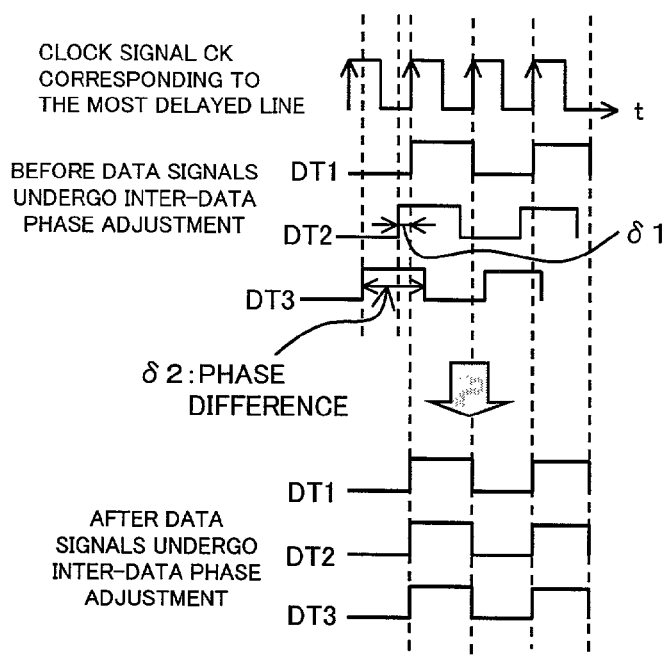

Now, it is assumed that there are phase differences bought about among the data signals as shown in FIG. 10(b). That is, a phase difference δ1 is brought about between the data signal DT2 and the clock signal corresponding to the data signal DT1. Also, a phase difference δ2 is brought about between the data signal DT3 and the clock signal corresponding to the data signal DT1.

If the clock signal corresponding to the data signal DT1 is a clock signal of the most delayed data signal channel (line), and the D flip-flops 52-1 and 52-2 generate a signal in synchronism with the clock signal, then, as shown in a part of the diagram of FIG. 10(b) illustrating a state after inter-data adjustment, the phase differences δ1 and δ2 of the data signals DT2 and DT3 relative to the clock signal can be compensated. Thus, each of the data signals DT1 to DT3 can be outputted with the same phase.

As described above, if the parallel signal automatic phase adjusting circuit 1 and the inter-data phase adjusting circuit 50 according to the present embodiment are employed in the parallel signal processing unit 312 shown in FIG. 9, the parallel/serial converting unit 313 placed on the downstream side of the parallel signal processing unit 312 can receive a set of data signals DT1 to DTn with the same phase. Therefore, the parallel/serial converting unit 313 can convert the supplied signals into a serial signal with ease.

As described above, according to the parallel signal automatic phase adjusting circuit 1A as the first modification of the first embodiment of the present invention, in addition to an advantage similar to that of the aforesaid first embodiment, there can be obtained an advantage that a set of data signals having the same phase can be created by a simple circuit arrangement such as the inter-data phase adjusting circuit 50.

When a communication system is constructed, system components such as IC devices are connected to each other by means of a coaxial cable composed of a data signal lines, a clock line and so on. In such a situation, it is requested that the length of the coaxial line is adjusted at each line so that scattering in phase among signals transmitted through the lines is suppressed. When such adjustment scheme is executed, a problem may arise. That is, the length of the delay lines shall be adjusted at high precision. However, according to the parallel signal automatic phase adjusting circuit 1A as the first modification of the first embodiment of the present invention, the problem that the length of the delay lines shall be adjusted at high precision can be effectively solved.

When the arrangement of the parallel signal automatic phase adjusting circuit 1A as the first modification of the first embodiment is compared with that of the first embodiment which is typically illustrated in FIG. 2, the advantage of the parallel signal automatic phase adjusting circuit 1A as the first modification will be more fully described. That is, as shown in FIG. 2, when a set of data signal flows are applied with a clock signal CK as a trigger when the set of data are temporarily held in a set of flip-flops, it is expected that a set of data can be outputted with the same phase. However, as shown in FIG. 10(b), when the set of data signal flows are deviated in phase from one another, it is difficult to apply the clock signal as a trigger precisely. Accordingly, if the above scheme is applied to a number of DT signal lines in which phase deviation from one another can be brought about, then a range of a time slot allowable to trigger the data output will be narrowed. However, according to the parallel signal automatic phase adjusting circuit 1A as the first modification of the first embodiment of the present invention, this drawback can be comfortably solved.

(a3) Description of Second Modification of First Embodiment

Figure 11:
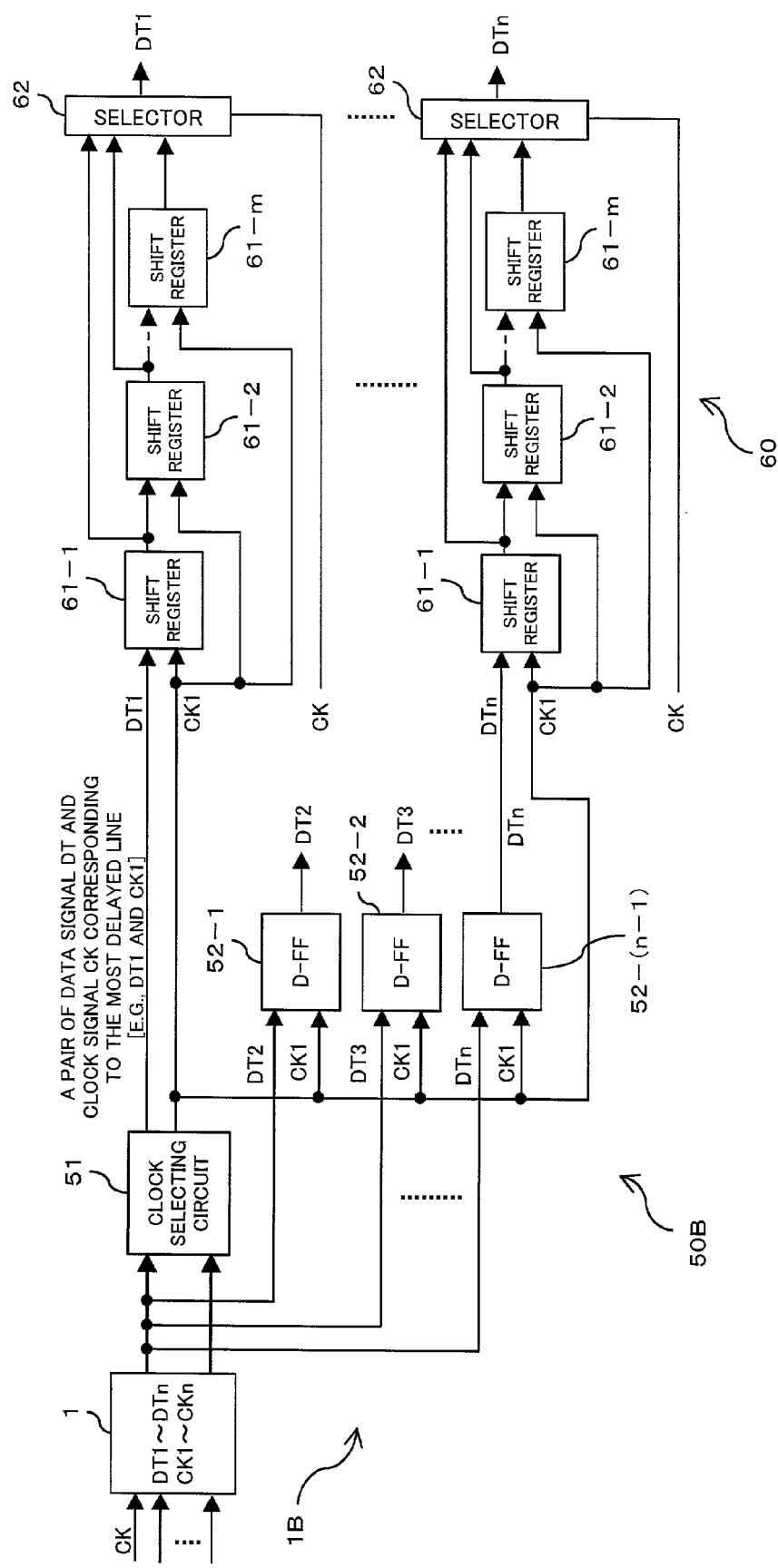
FIG. 11 is a block diagram showing a parallel signal automatic phase adjusting circuit according to a second modification of the first embodiment of the present invention.

FIG. 11 is a block diagram showing an arrangement of a parallel signal automatic phase adjusting circuit as a second modification of the first embodiment of the present invention. Similarly to the circuit 1A shown in FIG. 10(a), the parallel signal automatic phase adjusting circuit 1B shown in FIG. 11 also can be provided in the optical relay regenerators (reg) 302 and 303 in an optical communication system shown in FIG. 8. However, according to the arrangement of the second modification of the parallel signal automatic phase adjusting circuit 1B, even if the set of data signals contain a phase deviation of more than one time slot amount, the parallel signal automatic phase adjusting circuit 1B can compensate for the deviation.

That is, in the inter-data phase adjusting circuit 50 according to the above-described first modification of the first embodiment, as for example shown in FIG. 12(a), the inter-data phase adjusting circuit 50 can adjust the phase deviation between the data signals DT1 and DT2 (see FIG. 12(b)), under the condition that the phase deviation between the data signals DT1 and DT2 falls within a range of one time slot. Conversely, according to the arrangement of the circuit 1B shown in FIG. 11, even if the phase deviation between the data signals exceeds one time slot amount, this phase deviation can be adjusted.

The arrangement of the parallel signal automatic phase adjusting circuit 1B shown in FIG. 11 is different from that of the parallel signal automatic phase adjusting circuit 1A shown in FIG. 10(a) in the construction of the inter-data phase adjusting circuit 50B.

That is, in addition to the clock selecting circuit 51 and the D flip-flops 52-1 to 52-(n-1) which are also included in the first modification, the inter-data phase adjusting circuit 50B of the second modification of the first embodiment is arranged to include, a register circuit section 60 on the downstream side of the clock selecting circuit 51 and the D flip-flops 52-1 to 52-(n-1). The register circuit section 60 is capable of compensating for the phase deviation exceeding one time slot amount based on bit information of each data signal.

The register circuit section 60 is arranged to include a plurality of shift registers 61-1 to 61-$m$ connected to one another in a cascade fashion and a selector 62 provided on each channel of the data signals DT1 to DTn.

Each set of shift registers 61-1 to 61-$m$ provided at each data channel is supplied with a corresponding data signal from the clock selecting circuit 51 or the D flip-flops 52-1 to 52-(n-1) and holds the supplied data. Each set of shift registers 61-1 to 60-$m$ is also supplied with a clock signal and is operated in response to the clock input. In other words, the set of shift registers 61-1 to 61-$m$ is arranged to hold the data signal of each data channel in a unit of time slot.

That is, in each set of shift registers 61-1 to 61-$m$, the inputted data signal is generated to the successive shift register and the selector 62 provided on the downstream side of the register section at the same timing, in response to a clock signal supplied to the clock selecting circuit 51.

The selector 62 selects a proper one of the data signals supplied from any of the shift registers 61-1 to 61-$m$ and outputs the selected data signal in response to a clock signal supplied thereto for data signal selection.

In other words, the selector 62 is provided at each channel of the data signal, supplied with output signals from the respective shift registers 61-1 to 61-$m$ constituting the shift register set which is provided at every data signal channel, and outputs the corresponding one of the data signals DT1 to DTn at the same timing in accordance with the select signal which is useful for extracting the data signal at the same timing.

The above-described clock signal CK as the select signal useful for extracting the data signal at the same timing can be created in the following manner, for example. That is, although not shown, a processing unit for comparing data signals with each other compares between data signals in bit information such as frames or particular fixed bits of the data signals or the like. Then, this clock signal is outputted at a timing of frame synchronism or a timing of the particular fixed bit input.

Thus, even if phase deviation exceeding one time slot amount is brought about between the data signals, the respective data signals can be outputted at the same phase in a synchronized fashion.

With the above arrangement, even in the second modification of the first embodiment of the present invention, similarly to the above-described first embodiment, the phase comparing delay circuit 30-1 to 30-$n$ and the frequency converting circuit 40-1 to 40-$n$ can adjust in phase each of the clock signals CK1 to CKn together with corresponding one of the data signals DT1 to DTn, and output the adjusted clock signals CK1 to CKn.

The inter-data phase adjusting circuit 50B is a circuit for adjusting the phase deviation brought about between data signals. That is, if the phase deviation between data signals is equal to or smaller than one time slot amount, the clock selecting circuit 51 and the D flip-flops 52-1 and 52-(n-1) adjust this kind of phase deviation. Conversely, if the phase deviation between data signals is larger than one time slot amount, the shift register circuit section 60 adjusts this kind of phase deviation.

That is, the selector 62 selects a data signal from proper one of the shift registers 61-1 to 61-$m$ and outputs the selected data signal, in accordance with the clock signal CK for selection which is selected from the data signals outputted from the respective shift registers 61-1 to 61-$m$ and which is inputted at a timing of frame synchronism or a timing of the particular fixed bit input. In this way, the shift register circuit section 60 can adjust the phase deviation between data signals larger than one time slot amount, and output the respective data signals in a synchronized fashion.

As described above, according to the parallel signal automatic phase adjusting circuit 1B as the second modification of the first embodiment of the present invention, in addition to an advantage similar to those of the aforesaid first embodiment and the first modification of the first embodiment, there can be obtained an advantage that the shift register circuit section 60 can adjust the phase deviation between data signals larger than one time slot amount. Therefore, if the communication system goes to the step of multiplexing the data signals, the performance of the system can be improved.

(a4) Description of Third Modification of First Embodiment

Figure 13:
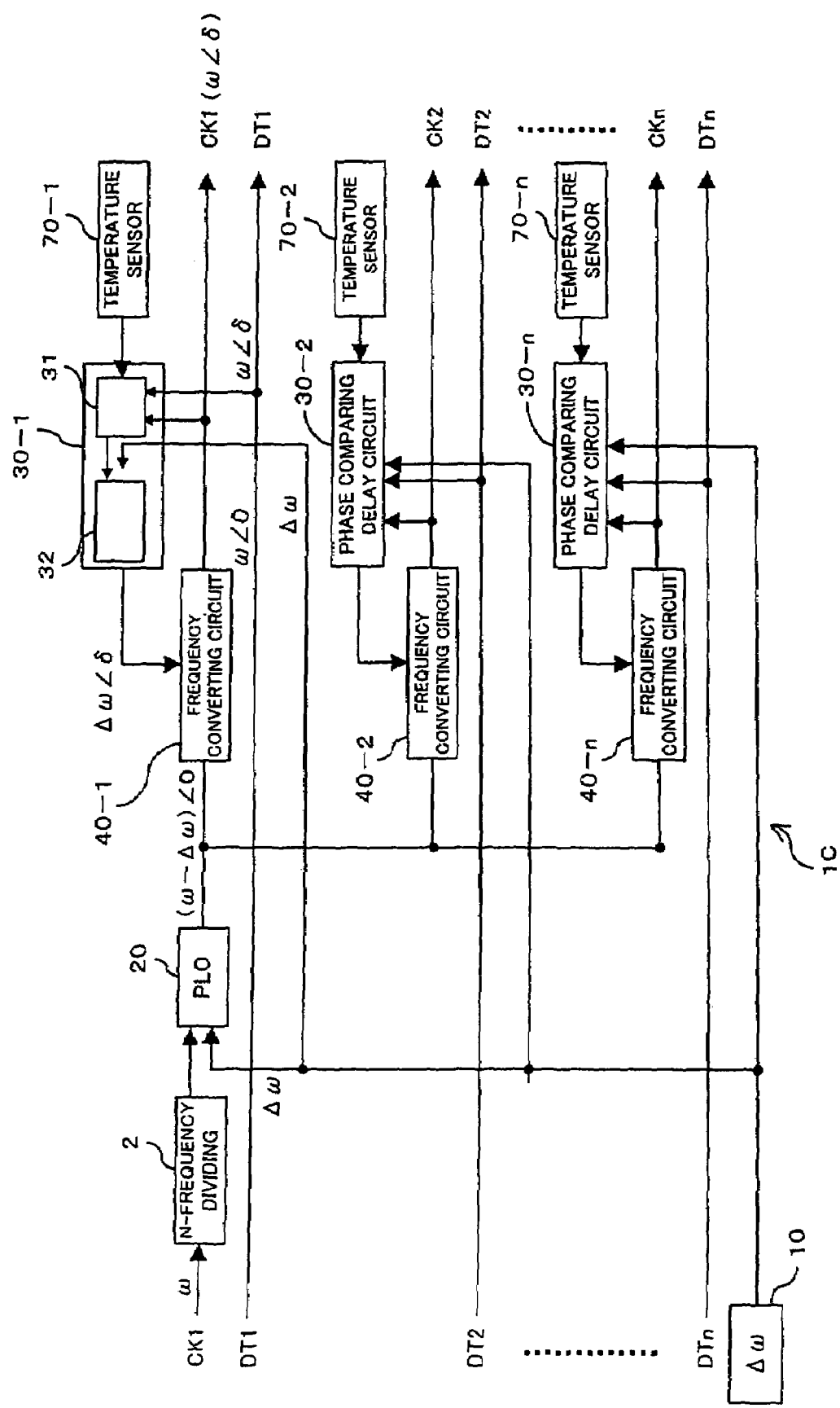
FIG. 13 is a block diagram showing a parallel signal automatic phase adjusting circuit according to a third modification of the first embodiment of the present invention.

FIG. 13 is a block diagram showing an arrangement of a parallel signal automatic phase adjusting circuit as a third modification of the first embodiment of the present invention. The parallel signal automatic phase adjusting circuit 1C shown in FIG. 13 differs from the aforesaid parallel signal automatic phase adjusting circuit as the first embodiment (see the arrangement shown at reference numeral 1 in FIG. 1) in the following point. That is, each of the phase comparing delay circuits 30-1 to 30-$n$ is coupled to a temperature sensor unit 70-1 to 70-$n$ which compensates for the temperature dependability of the voltage signal (containing phase comparing information). Each temperature sensor unit 70-1 to 70-$n$ is capable of compensating for a temperature-deriving component of the phase difference δ of the voltage signal supplied from the phase comparing circuit 31 in each of the phase comparing delay circuits 30-1 to 30-$n$.

That is, the temperature sensor unit 70-1 to 70-$n$ detects a change of temperature, and the output voltage signal from the phase comparing circuit 31 is controlled in accordance with the result of temperature detection by using a circuit element such as a resistor, not shown, so that the temperature dependability is compensated for.

As described above, according to the parallel signal automatic phase adjusting circuit 1C as the third modification of the first embodiment of the present invention, in addition to an advantage similar to those of the aforesaid first embodiment, there can be obtained an advantage that the temperature dependability of the phase comparing circuit 31 is compensated for. Accordingly, the adjustment on the phase difference between the clock signal and the data signal can be carried out in an extremely reliable manner.

(b) Description of Second Embodiment

Figure 14:
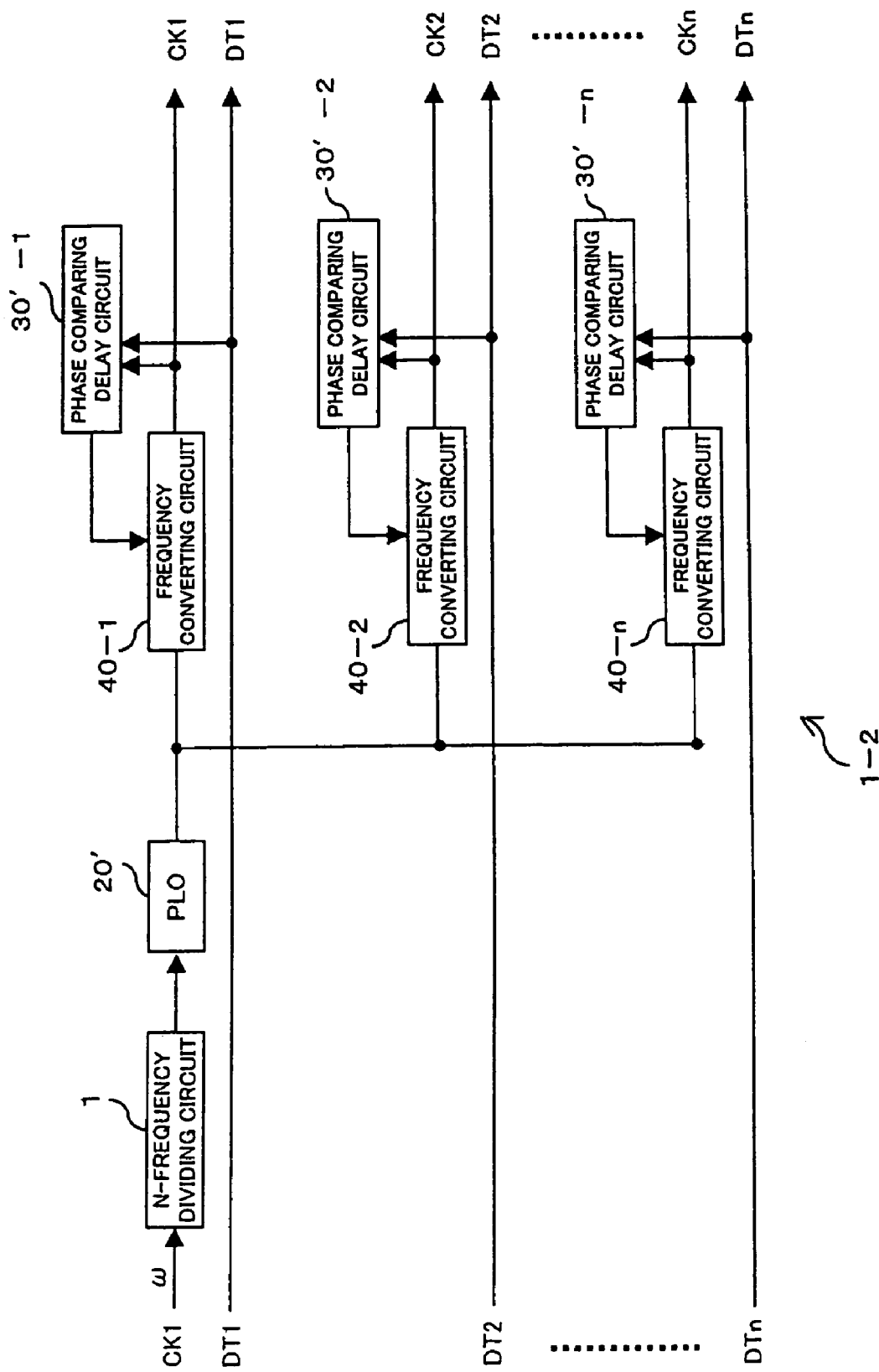
FIG. 14 is a block diagram showing a parallel signal automatic phase adjusting circuit according to a second embodiment of the present invention.

FIG. 14 is a block diagram showing an arrangement of a parallel signal automatic phase adjusting circuit as a second embodiment of the present invention. Also the parallel signal automatic phase adjusting circuit 1-2 shown in FIG. 14 can be applied to a communication system such as one shown in FIG. 19 in which parallel digital data are transmitted together with a clock signal from one to another of the system components 100A to 100C.

Similarly to the arrangement of the aforesaid first embodiment, the parallel signal automatic phase adjusting circuit 1-2 shown in FIG. 14 also is supplied with data signals of a plurality of channels in parallel together with a clock signal, and the parallel signal automatic phase adjusting circuit 1-2 adjusts the clock signal so as to be synchronized with the data signal of a corresponding channel.

The arrangement of the parallel signal automatic phase adjusting circuit 1-2 according to the second embodiment is different from that of the aforesaid circuit 1 as the first embodiment (see FIG. 1) in the following points. That is, the parallel signal automatic phase adjusting circuit 1-2 is not arranged to include the Δω oscillator 10, and the PLO 20 provided in the circuit 1 as the first embodiment is replaced with a PLO 20' arranged in a manner different from the PLO 20. Further, the phase comparing delay circuits 30-1 to 30-n are also replaced with phase comparing oscillating circuits 30'-1 to 30'-n which are also arranged in a manner different from the phase comparing delay circuits 30-1 to 30-n. Other portions are similar to those of the circuit 1 shown in FIG. 1.

In FIG. 14, like parts corresponding to those in FIG. 1 are identified by the same reference numerals.

Figure 21:
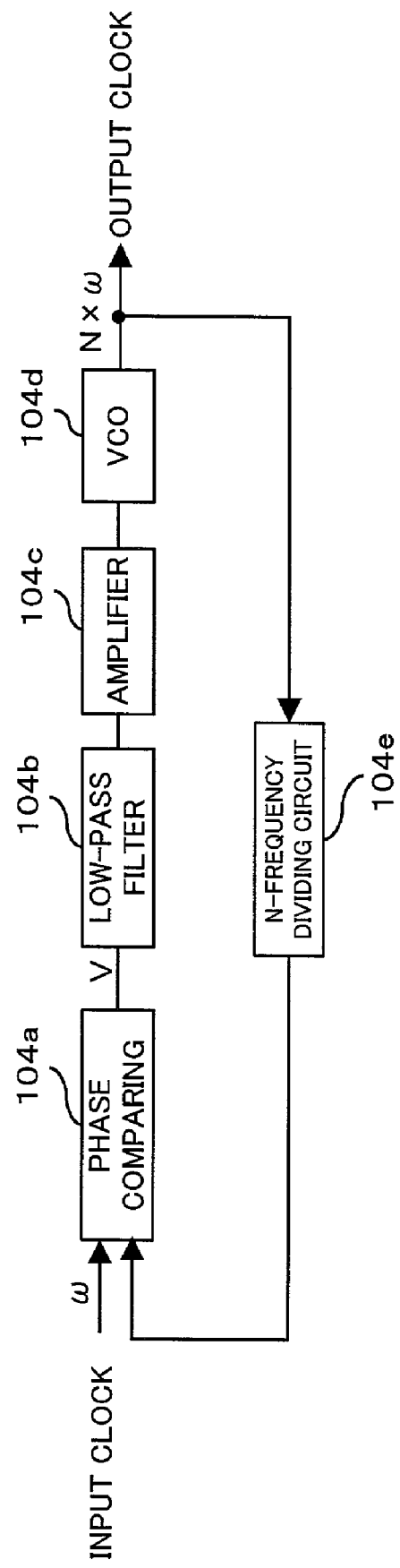
FIG. 21 is a block diagram showing a main portion of the parallel signal automatic phase adjusting circuit shown in FIG. 20.

The arrangement of the PLO 20' as an oscillating circuit can be illustrated in detail in aforesaid FIG. 21. That is, the PLO 20' is arranged to include a phase comparing circuit, a low-pass filter, an amplifier, a VCO and N-frequency dividing circuit (see blocks shown at reference numerals 104a to 104e).

Figure 20:
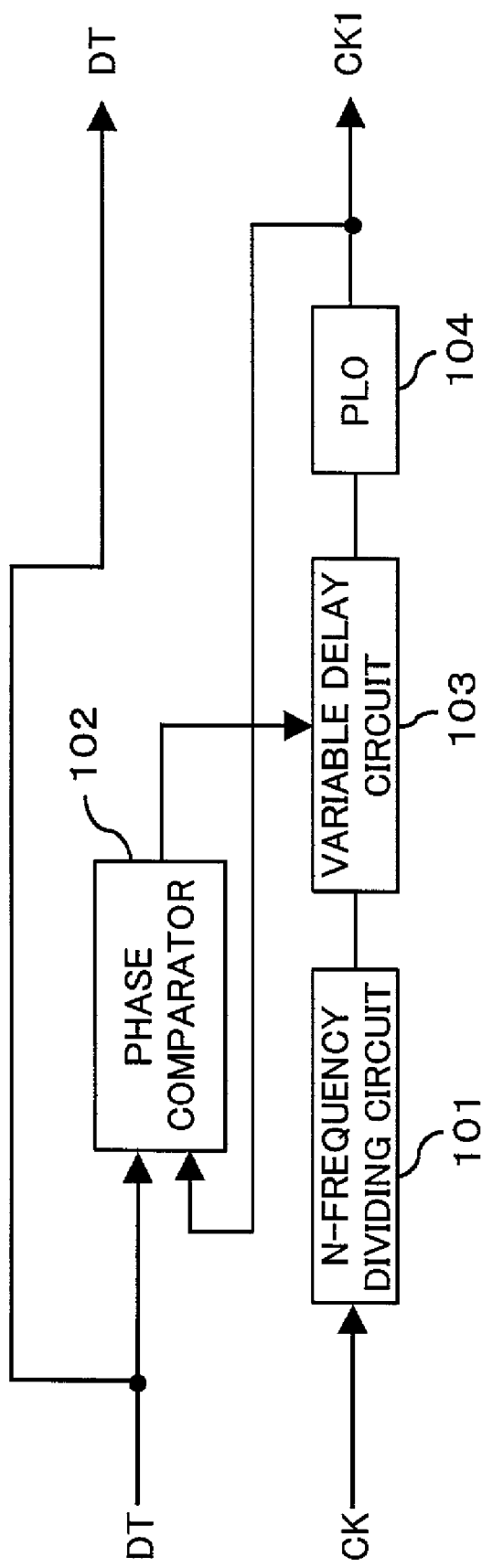
FIG. 20 is a diagram of a parallel signal automatic phase adjusting circuit for automatically adjusting a phase between a data signal and a clock signal.

The PLO 20' shares the same arrangement with the aforesaid PLO 20 shown in FIG. 1 in that the PLO 20' oscillates by generating a clock signal at a frequency of (ω−Δω), which derives from subtracting a frequency of Δω from a frequency ω of the clock signal inputted into the N-frequency dividing circuit 2. However, the PLO 20' is different from the PLO 20 in the following point. That is, in the PLO 20', the clock signal having the frequency of (ω−Δω) is created without using the signal having a frequency of Δω generated from the Δω oscillator 10 provided outside the PLO, but only an amplification factor of the amplifier (see the block shown at reference numeral 104c in FIG. 20) is adjusted so as to create the clock signal having the frequency of (ω−Δω).

Each of the phase comparing oscillating circuits 30'-1 to 30'-n provided so as to correspond to respective channels of data signals DT1 to DTn is a circuit for oscillating by generating a frequency signal at a frequency same as the frequency of Δω which is decreased by the PLO 20'. The phase comparing oscillating circuit 30'-1 to 30'-n also compares the corresponding data signal with the clock signal, whereby a signal containing phase difference information is generated therefrom together with frequency information Δω. In more concretely, information indicative of phase difference δ as a result of comparison is made involved in the signal having a frequency of Δω which is generated by oscillation within the phase comparing oscillating circuit 30'-1 to 30'-n, and the resultant signal is supplied to the frequency converting circuit 40-1 to 40-n.

Figure 15:
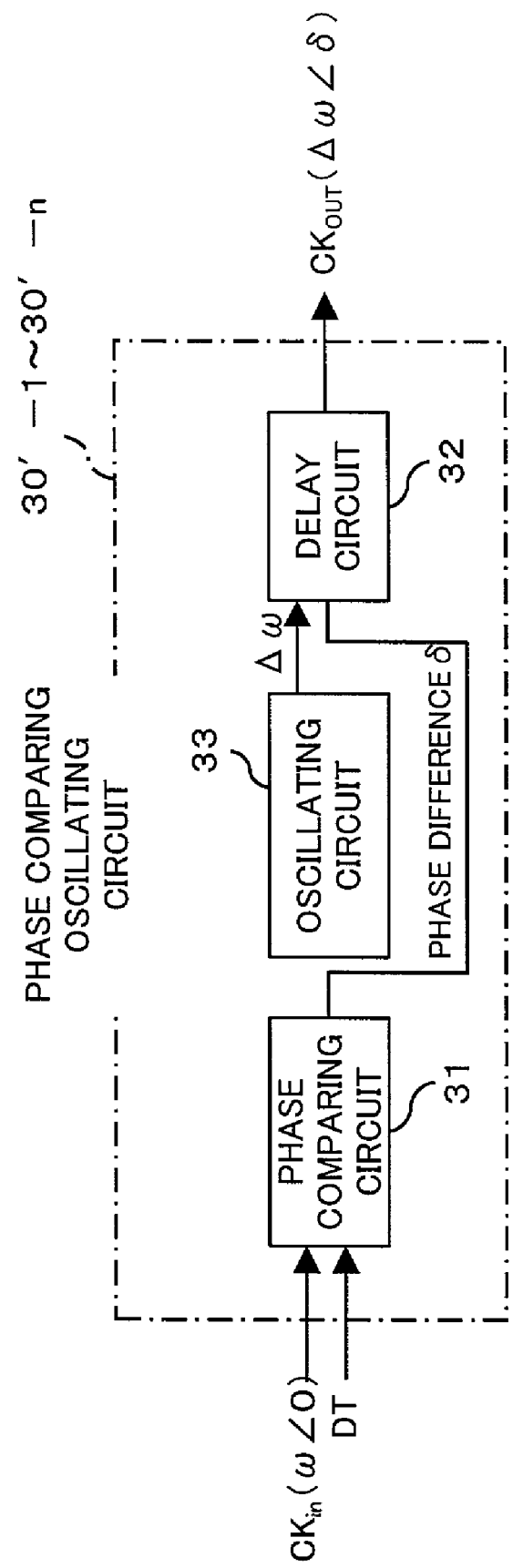
FIG. 15 is a block diagram showing a phase comparing oscillating circuit in the second embodiment of the present invention.

FIG. 15 is a diagram showing in more detail the arrangement of the phase comparing delay circuit 30'-1 to 30'-n. As shown in FIG. 15, the phase comparing oscillating circuit 30'-1 to 30'-n is arranged to include the phase comparing circuit 31 and the delay circuit 32, which are similar to those of the aforesaid phase comparing delay circuit 30-1 to 30-n shown in FIG. 3. Further, the phase comparing oscillating circuit 30'-1 to 30'-n additionally includes an oscillating circuit 33.

The oscillating circuit 33 is a circuit for generating a signal having a frequency equivalent to the predetermined frequency Δω which is subtracted from the frequency ω of the clock signal by the PLO 20'. With this arrangement, the delay circuit 32 is supplied with the signal containing the phase difference δ between the data signal and the clock signal from the phase comparing circuit 31. The delay circuit 32 is also supplied with the signal having the frequency of Δω from the oscillating circuit 33. Thus, the signal having the frequency of Δω is delayed by the phase difference δ and outputted from the delay circuit 32.

In this way, similarly to the aforesaid case of the first embodiment, the frequency converting circuit 40-1 to 40-n as the calculating circuit adjusts the clock signal supplied from the PLO 20' so that the clock signal is synchronized with the corresponding data signal, and outputs the adjusted clock signal, based on an arithmetic operation of trigonometric functions using as a parameter, the clock signal from the PLO 20' and the information supplied from the phase comparing oscillating circuit 30'-1 to 30'-n.

Accordingly, if the parallel signal automatic phase adjusting circuit 1-2 according to the second embodiment of the present invention having the above arrangement is applied to the transmission system composed of the system components 100A to 100C shown in FIG. 19, the parallel signal automatic phase adjusting circuit 1-2 functions as follows. That is, when a set of parallel signals are transmitted between the system components 100A to 100C, a side of component, which receives a set of data signals in a parallel fashion together with the clock signal, can compensate for the phase difference between the clock signal CK and corresponding one of the data signals DT1 to DTn at the preceding stage where the data are supplied in synchronism with the clock signal.

That is, the PLO 20' oscillates by generating the clock signal having a fixed phase at the frequency of (ω−Δω) based on the clock signal which is frequency-divided into one having one N-th frequency by the N-frequency circuit 2. In other words the PLO 20' oscillates by generating the clock signal at the frequency of (ω−Δω) which derives from subtracting the predetermined frequency Δω from the frequency of the inputted clock signal, ω.

The signal generated from the PLO 20' is supplied to the frequency converting circuit 40-1 to 40-n of each data signal channel. Each of the frequency converting circuits 40-1 to 40-n is supplied with the signal from the above-described PLO 20' together with a signal having the frequency of Δω containing the phase difference information δ indicative of the difference from the data signal generated from the corresponding phase comparing oscillating circuit 30'-1 to 30'-n. Thus, the frequency converting circuit 40-1 to 40-n carries out a signal processing equivalent to the above-described Equation (3) based on the supplied signals.

Owing to the signal processing carried out by the frequency converting circuit 40-1 to 40-n it becomes possible to obtain a clock signal CK1 to CKn in which the phase difference between each data signal DT1 to DTn and the clock signal is compensated for.

As described above, when the system component on the side of reception shown in FIG. 19 is supplied with the clock signal CK1 to CKn having undergone compensation in correspondence with each of the data signals DT1 to DTn as a set of parallel signals, a signal processing unit, which is provided on the downstream side, although not shown, intakes each of the data signals DT1 to DTn as a set of parallel signals in synchronism with the clock signal having the phase difference.

As described above, according to the parallel signal automatic phase adjusting circuit 1-2 of the second embodiment of the present invention, the PLO 20' is shared by each of the data signal channels. Therefore, unlike the aforesaid case shown in FIG. 22, the PLO circuit need not be provided on each data signal channel, with the result that the size of the system in which the parallel data signals are handled can be made small, the number of components constituting the system can be decreased, which facts lead to a merit of cost reduction. In particular, when it is requested to build a circuit having a great number of parallel data lines the system can free from becoming large, and cost increase can be suppressed.

That is, in the circuit 1-2 as the second embodiment, a single unit of PLO 20' is shared by a number of data signal channels, and the phase comparing oscillating circuit 30'-1 to 30'-n and the frequency converting circuit 40-1 to 40-n which are provided for each of the data signal channels, are sufficiently small-sized. Therefore, the system can be also small-sized and at the same time, cost can be reduced owing to the reduction of the number of components.

Similarly to the aforesaid first embodiment, the above-described parallel signal automatic phase adjusting circuit 1-2 as the second embodiment may be arranged to include the inter-data phase adjusting circuits 50, 50B as shown in FIG. 10(*a*) or FIG. 11. With this arrangement, advantages or effects fundamentally similar to those of the aforesaid first embodiment can be obtained.

(C) Description of Third Embodiment

Figure 16:
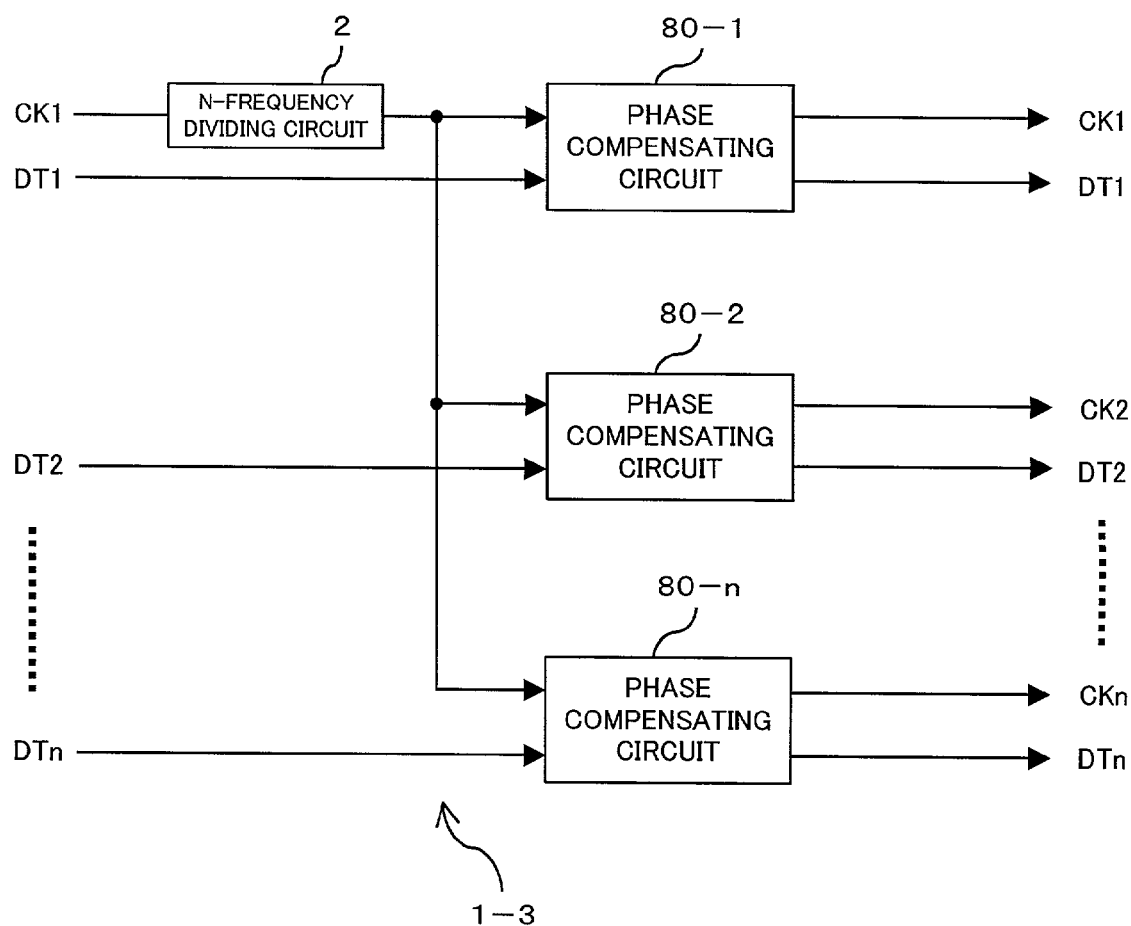
FIG. 16 is a block diagram showing a parallel signal automatic phase adjusting circuit according to a third embodiment of the present invention.

FIG. 16 is a block diagram showing an arrangement of a parallel signal automatic phase adjusting circuit as a third embodiment of the present invention. Also the parallel signal automatic phase adjusting circuit 1-3 shown in FIG. 16 can be applied to a communication system such as one shown in FIG. 19 in which parallel digital data are transmitted together with a clock signal from one to another of the system components 100A to 100C.

Similarly to the arrangement of the aforesaid first and second embodiments, the parallel signal automatic phase adjusting circuit 1-3 shown in FIG. 16 also is supplied with data signals of a plurality of channels in parallel together with a clock signal, and the parallel signal automatic phase adjusting circuit 1-3 adjusts the clock signal so as to be synchronized with the data signal of a corresponding channel.

In this case, the parallel signal automatic phase adjusting circuit 1-3 shown in FIG. 16 is arranged to include the N-frequency dividing circuit 2 and phase compensating circuits 80-1 to 80-n as an adjusting circuit section. The adjusting circuit section adjusts a clock signal so as to be synchronized with each data signal and outputs the adjusted clock signal from each of the phase compensating circuits 80-1 to 80-n.

Figure 17:
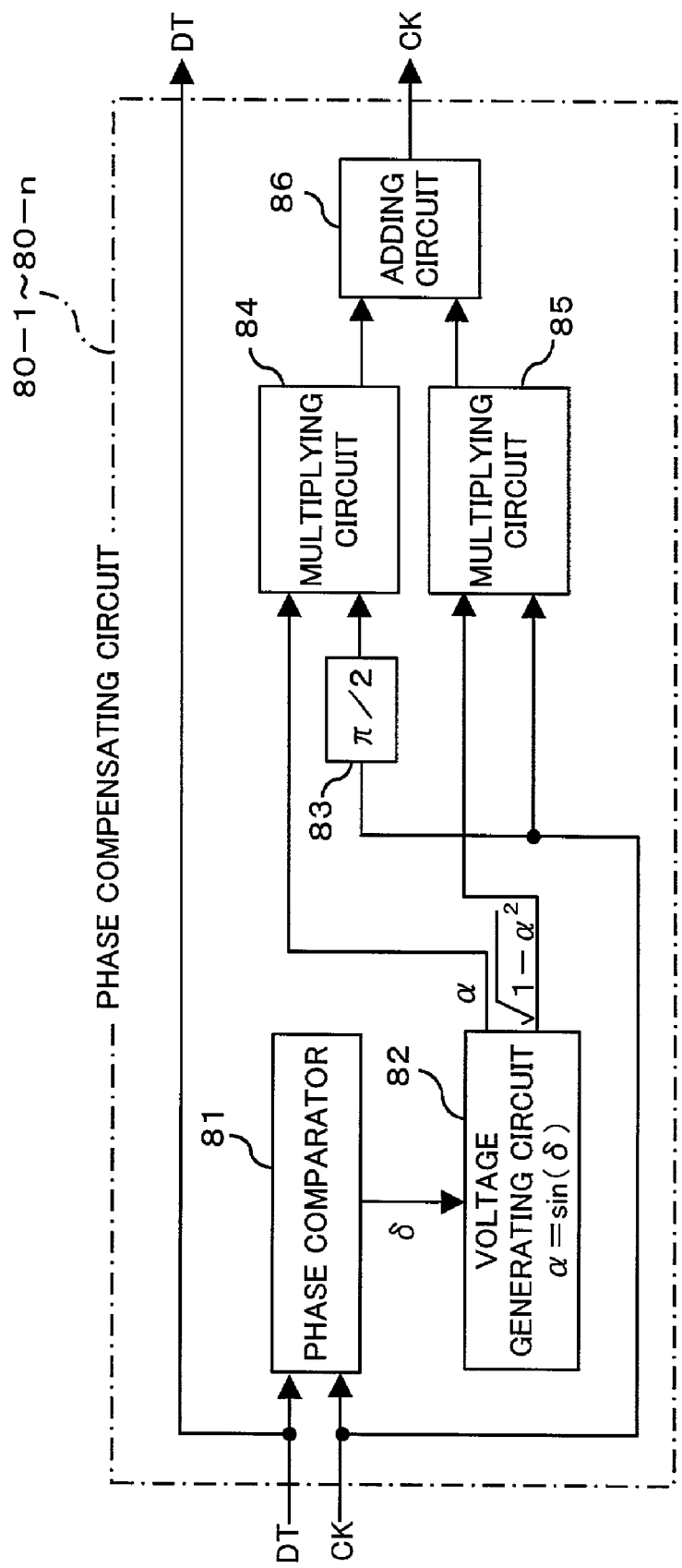
FIG. 17 is a diagram showing a phase compensating circuit employed in the parallel signal automatic phase adjusting circuit according to the third embodiment.

Each phase compensating circuit 80-1 to 80-n is supplied with a clock signal having undergone N-frequency dividing processing in the N-frequency dividing circuit 2 and one of data signals DT1 to DTn of corresponding data channel. The phase compensating circuit 80-1 to 80-n also generates a clock signal of which phase deviation relative to the corresponding data signal is canceled. FIG. 17 is a diagram showing in detail the arrangement of the phase compensating circuit 80-1 to 80-n. As shown in FIG. 17, the phase compensating circuit 80-1 to 80-n is arranged to include a phase comparator 81, a voltage generating circuit 82, a phase shift unit (π/2) 83, multiplying circuits 84 and 85, and an adding circuit 86.

The phase comparator 81 compares in phase a clock signal having undergone N-frequency dividing operation in the above-described N-frequency dividing circuit 2 with the corresponding data signal, and also generates a voltage signal in accordance with the phase difference δ deriving from the comparison. The phase comparator 81 has an arrangement fundamentally similar to that of the phase comparing circuit 31 which is shown in more detail in FIG. 3.

The voltage generating circuit 82 is supplied with a voltage signal indicative of the phase difference δ from the phase comparator 81, and generates a voltage signal indicating a coefficient value which is utilized when the multiplying circuits 84 and 85 and the adding circuit 86 provided on the downstream side of the voltage generating circuit 82 carry out arithmetic operation on the clock signal.

In other words, the multiplying circuits 84 and 85 and the adding circuit 86 provided on the downstream side of the voltage generating circuit 82 regard the waveform of the clock signal as a sine wave or a cosine wave. Thus, the clock signal supplied from the phase comparator 81 is subjected to an arithmetic operation using the trigonometric functions expressed in the following Equation (6) in accordance with the phase difference δ.

That is, if δ is taken as the phase difference of the clock signal relative to the data signal that should be compensated for, and ω is taken as a frequency of the clock signal supplied to the N-frequency dividing circuit 2, then similarly to the case of the aforesaid Equation (2), the output clock signal Vck can be expressed as a sine wave signal. If Equation (2) is transformed into one expressed in Equation (6), the timing when the data signal is triggered to be outputted can be adjusted.

$$VCk = V0\sin(\omega t + \delta) \quad (6)$$
$$= V0\sin(\omega t) \cdot \cos(\delta) + V0\cos(\omega t) \cdot \sin(\delta)$$
$$= V0\sin(\omega t)t \cdot (1 - \alpha^2)^{1/2} + V0\cos(\omega t) \cdot \alpha$$

In this case, the voltage generating circuit 82 is a circuit for generating a voltage signal equivalent to the coefficient α of the first term $(1-\alpha^2)^{1/2}$ and the second term α in the above Equation (6) when α=sin(δ). A voltage signal corresponding to the coefficient of the first term is created by the multiplying circuit 85 while a voltage signal corresponding to the coefficient of the second term is created by the multiplying circuit 84.

Figure 18:
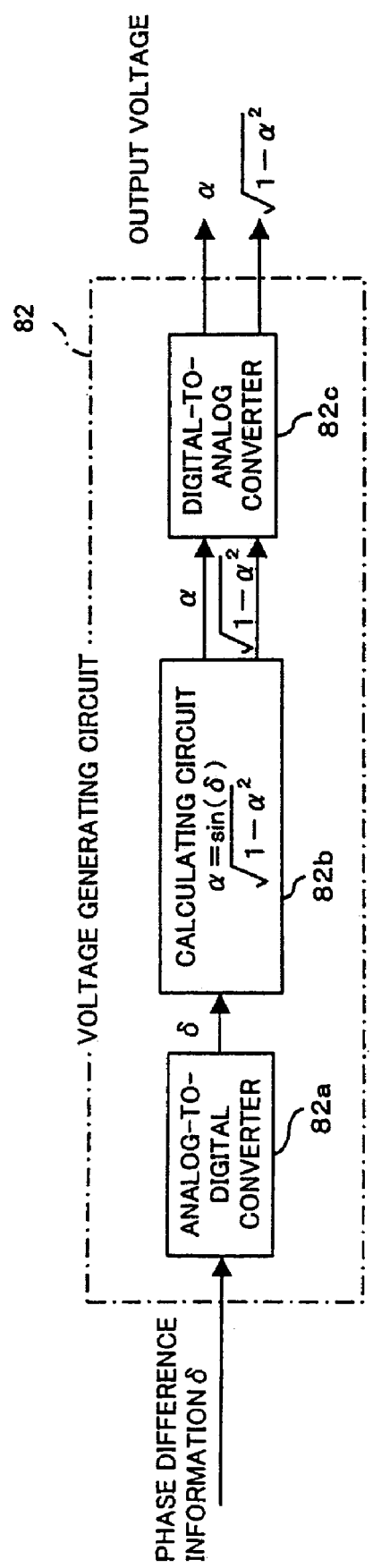
FIG. 18 is a diagram showing a main portion of the phase compensating circuit employed in the automatic phase adjusting circuit according to the third embodiment.

FIG. 18 is a diagram showing in detail the arrangement of the voltage generating circuit 82. As shown in FIG. 18, the voltage generating circuit 82 is arranged to include an analog-to-digital converter 82a for converting the voltage signal equivalent to the phase difference δ supplied from the phase comparator 81, a calculating circuit 82b for effecting arithmetic processing to yield the above-described data of two coefficients by using the phase difference information δ which is converted into a digital signal by the analog-to-digital converter 82a, and a digital-to-analog converter 82c for converting the data of the two coefficients deriving from the calculation of the calculating circuit 82b.

The phase shift unit 83 is a unit for shifting the clock signal supplied from the N-frequency dividing circuit 2 in phase by π/2. With this unit, the sine wave function of the first term of the aforesaid Equation (6) indicating a component of the clock signal having the frequency ω can be converted into the cosine wave function of the second term of the same equation.

With this arrangement, the multiplying circuit 84 calculates the second term of the aforesaid Equation (6) while the multiplying circuit 85 calculates the first term of the same Equation (6). Further, the adding circuit 86 adds the calculation results of the multiplying circuit 84 and the multiplying circuit 85 together, whereby the result of the arithmetic operation on Equation (6) can be outputted.

As described above, the arrangement composed of the voltage generating circuit 82, the phase shift unit 83, the multiplying circuits 84 and 85 and the adding circuit 86 can function as a trigonometric function calculating unit for effecting adjustment on the clock signal so that the clock signal is synchronized with the data signal, based on the trigonometric function calculation using the phase comparing information supplied from the phase comparator 81 as a parameter.

Accordingly, if the parallel signal automatic phase adjusting circuit 1-3 according to the third embodiment of the present invention having the above arrangement is also applied to the transmission system composed of the system components 100A to 100C shown in FIG. 19, the parallel signal automatic phase adjusting circuit 1-3 functions as follows. That is, when a set of parallel signals are transmitted between the system components 100A to 100C, a side of component, which receives a set of data signals in a parallel fashion together with the clock signal, can compensate for the phase difference between the clock signal CK and corresponding one of the data signals DT1 to DTn at the preceding stage where the data are supplied in synchronism with the clock signal.

That is, the phase compensating circuit 80-1 to 80-n provided on each data channel calculates the coefficient values based on the electric signal corresponding to the phase difference δ between the inputted clock signal and the data signal, whereby processing equivalent to the arithmetic operation expressed by Equation (6) is carried out and the timing for extracting a target data piece from the data signal is adjusted.

Figure 22:
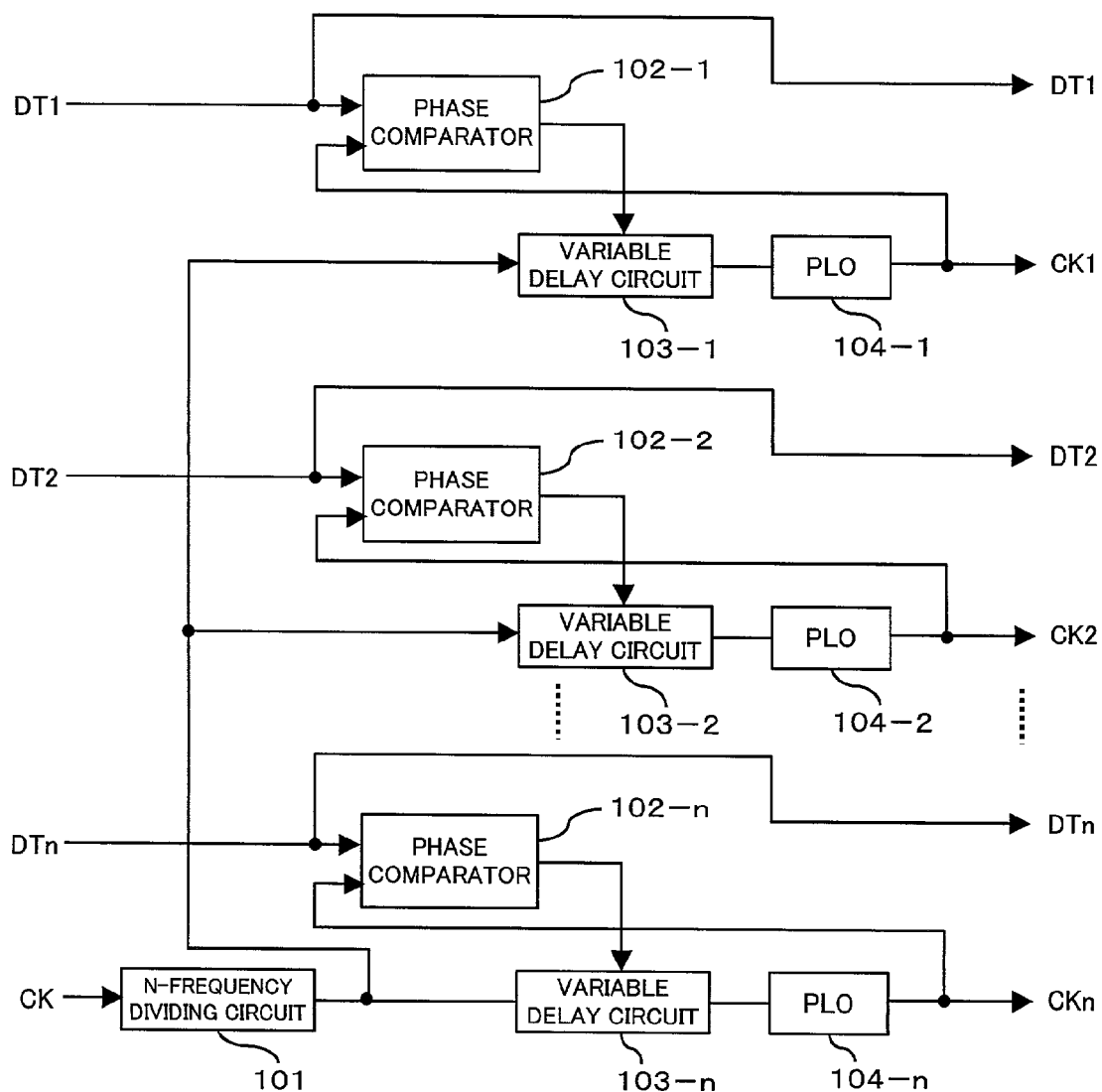
FIG. 22 is a diagram showing a circuit for adjusting phases of parallel signals.

As described above, according to the parallel signal automatic phase adjusting circuit 1-3 as the third embodiment of the present invention, it becomes unnecessary to provide the variable delay circuit 103-1 to 103-n and the PLO 104-1 to 104-n of each data channel, unlike the case of the circuit shown in FIG. 22. Accordingly, the system can be remarkably small-sized and at the same time, cost can be reduced owing to the reduction of the number of components constituting the system.

(d) Other Disclosure

In the above-described circuits of the respective embodiments, except for the first and second modifications of the first embodiment, description has been made on a case where the arrangement of the present invention is applied to a system for transmitting and receiving a set of parallel signals. However, according to the present invention, as for example shown in FIGS. 8 and 9, the arrangement of the present invention can be naturally utilized as an automatic phase adjusting circuit provided on the upstream side of the component which converts a set of parallel signals into a serial signal.

What is claimed is:

1. A parallel signal automatic phase adjusting circuit having a number of data signal channels inputted together with a clock signal and adjusting the clock signal so that each clock signal is synchronized with each of the data signals, the parallel signal automatic phase adjusting circuit comprising:

adjusting circuits provided in correspondence to the respective data signal channels for effecting adjustment on the clock signal generated from the oscillating circuit so that the clock signal is synchronized with the corresponding data signal, wherein each of the adjusting circuits is arranged to include a phase comparator for comparing the clock signal and the data signal in phase and outputting a phase difference signal as a result of the comparing, and a trigonometric function calculating unit for performing a phase shift operation of the clock signal by the phase difference thereby effecting adjustment on the clock signal so that the clock signal is synchronized with the data signal, based on trigonometric function calculation using the phase difference signal outputted from the phase comparator as a parameter, wherein when δ represents a phase difference of the clock signal relative to the data signal and V0 sin ω represents the clock signal generated from the oscillating circuit, the trigonometric function calculation includes determining an adjusted clock signal Vck by Vck=V0 sin(ωt+δ)=V0 sin ωt*cos δ+V0 cos ωt*sin δ.

2. A parallel signal automatic phase adjusting circuit according to claim 1, comprising an inter-data phase adjusting circuit which is supplied with the clock signals having undergone adjustment by the respective adjusting circuits together with the corresponding data signal, and generates a plurality of kinds of data in synchronism with the timing of the most delayed clock signal.

3. A parallel signal automatic phase adjusting circuit according to claim 2, wherein the inter-data phase adjusting circuit is arranged to include a clock selecting circuit for selecting a clock signal having the most delayed timing from clock signals having undergone adjustment in the respective adjusting circuits, and a data output section for generating at the same timing data signals other than the data signal corresponding to the clock signal selected by the clock selecting circuit, based on the clock signal selected by the clock selecting circuit.

4. A parallel signal automatic phase adjusting circuit according to claim 3, wherein the data output section is composed of a number of data output units provided so as to correspond to the data signal channels, respectively, each of the data output units being made up of a flip-flop circuit operable in response to the selected clock signal.

5. A parallel signal automatic phase adjusting circuit according to claim 2, wherein the inter-data phase adjusting circuit is arranged to include a clock selecting circuit for selecting a clock signal having the most delayed timing from clock signals having undergone adjustment in the respective adjusting circuits, and for generating a data signal corresponding to the selected clock signal, a data output section for generating all of the data signals at the same timing based on the clock signal selected by the clock selecting circuit, and a register circuit section capable of compensating for a phase deviation exceeding one time slot amount based on bit information of respective data signals.

6. A parallel signal automatic phase adjusting circuit according to claim 5, wherein the register circuit section is arranged to include a plurality of shift registers connected in a cascade fashion so as to correspond to respective data signal channels, each of the shift registers being capable of holding data of corresponding data signal channel, and selectors provided so as to correspond to respective data signal channels so that each selector is supplied with an output signal from the shift registers in the corresponding data signal channel, all of the selectors being capable of outputting respective data stream at the same timing in response to a select signal useful for extracting data pieces having the same timing.

7. A parallel signal automatic phase adjusting circuit according to claim 1, wherein each of the adjusting circuits is arranged to include a temperature sensor for compensating for the temperature dependability of the phase comparing information.

8. A parallel signal automatic phase adjusting circuit having a number of data signal channels inputted together with a clock signal and adjusting the clock signal so that the clock signal is synchronized with each of the data signals, the parallel signal automatic phase adjusting circuit comprising:

a signal generator for generating a signal having a predetermined frequency smaller than a frequency which is utilized as the data signal or the clock signal;

an oscillating circuit for generating a clock signal having a frequency smaller than the inputted clock signal by the predetermined frequency generated from the signal generator; and adjusting circuits provided in correspondence to the respective data signal channels for effecting adjustment on the clock signal generated from the oscillating circuit so that the clock signal is synchronized with the corresponding data signal, based on an arithmetic operation of trigonometric functions using phase comparing information deriving from comparison between each of the data signal and the clock signal generated from the oscillating circuit and frequency information regarding the respective data signals, the clock signal generated from the oscillating circuit and the signal supplied from the signal generator, wherein each of the adjusting circuit is arranged to include a phase comparing delay circuit which is supplied with a signal from the signal generator, compares the corresponding data signal with the clock signal as a target of adjustment and generates phase comparing information therefrom as a result of comparison together with frequency information of a signal from the signal generator, and a calculating circuit for effecting adjustment on the clock signal generated from the oscillating circuit so that the clock signal is synchronized with the corresponding data signal based on a trigonometric function calculation using the clock signal supplied from the oscillating circuit and the information supplied from the phase comparing delay circuit.

9. A parallel signal automatic phase adjusting circuit according to claim 8, comprising an inter-data phase adjusting circuit which is supplied with the clock signals having undergone adjustment by the respective adjusting circuits together with the corresponding data signal, and generates a plurality of kinds of data in synchronism with the timing of the most delayed clock signal.

10. A parallel signal automatic phase adjusting circuit according to claim 9, wherein the inter-data phase adjusting circuit is arranged to include a clock selecting circuit for selecting a clock signal having the most delayed timing from clock signals having undergone adjustment in the respective adjusting circuits, and a data output section for generating at the same timing data signals other than the data signal corresponding to the clock signal selected by the clock selecting circuit, based on the clock signal selected by the clock selecting circuit.

11. A parallel signal automatic phase adjusting circuit according to claim 10, wherein the data output section is composed of a number of data output units provided so as to correspond to the data signal channels, respectively, each of the data output units being made up of a flip-flop circuit operable in response to the selected clock signal.

12. A parallel signal automatic phase adjusting circuit according to claim 9, wherein the inter-data phase adjusting circuit is arranged to include a clock selecting circuit for selecting a clock signal having the most delayed timing from clock signals having undergone adjustment in the respective adjusting circuits, and for generating a data signal corresponding to the selected clock signal, a data output section for generating all of the data signals at the same timing based on the clock signal selected by the clock selecting circuit, and a register circuit section capable of compensating for a phase deviation exceeding one time slot amount based on bit information of respective data signals.

13. A parallel signal automatic phase adjusting circuit according to claim 12, wherein the register circuit section is arranged to include a plurality of shift registers connected in a cascade fashion so as to correspond to respective data signal channels, each of the shift registers being capable of holding data of corresponding data signal channel, and selectors provided so as to correspond to respective data signal channels so that each selector is supplied with an output signal from the shift registers in the corresponding data signal channel, all of the selectors being capable of outputting respective data stream at the same timing in response to a select signal useful for extracting data pieces having the same timing.

14. A parallel signal automatic phase adjusting circuit according to claim 8, wherein each of the adjusting circuits is arranged to include a temperature sensor for compensating for the temperature dependability of the phase comparing information.

15. A parallel signal automatic phase adjusting circuit having a number of data signal channels inputted together with a clock signal and adjusting the clock signal so that the clock signal is synchronized with each of the data signals, the parallel signal automatic phase adjusting circuit comprising:

an oscillating circuit for generating a clock signal having a frequency smaller than the inputted clock signal by a predetermined frequency; and adjusting circuits provided in correspondence to the respective data signal channels for effecting adjustment on the clock signal generated from the oscillating circuit so that the clock signal is synchronized with the corresponding data signal, based on an arithmetic operation of trigonometric functions using as a parameter, phase comparing information deriving from comparison between each of the data signal and the clock signal generated from the oscillating circuit, frequency information regarding the clock signal and the data signals, and the frequency information of the predetermined frequency, wherein each of the adjusting circuit is arranged to include a phase comparing oscillating circuit which oscillates at a frequency identical to the predetermined frequency (decreased by the oscillating circuit), compares the corresponding data signal with the clock signal as a target of adjustment, and generates phase difference information therefrom as the frequency information, and a calculating circuit for effecting adjustment on the clock signal generated from the oscillating circuit so that the clock signal is synchronized with the corresponding data signal based on a trigonometric function calculation using the clock signal supplied from the oscillating circuit and the information supplied from a phase comparing delay circuit as parameters.

16. A parallel signal automatic phase adjusting circuit according to claim 15, comprising an inter-data phase adjusting circuit which is supplied with the clock signals having undergone adjustment by the respective adjusting circuits together with the corresponding data signal, and generates a plurality of kinds of data in synchronism with the timing of the most delayed clock signal.

17. A parallel signal automatic phase adjusting circuit according to claim 16, wherein the inter-data phase adjusting circuit is arranged to include a clock selecting circuit for selecting a clock signal having the most delayed timing from clock signals having undergone adjustment in the respective adjusting circuits, and a data output section for generating at the same timing data signals other than the data signal corresponding to the clock signal selected by the clock selecting circuit, based on the clock signal selected by the clock selecting circuit.

18. A parallel signal automatic phase adjusting circuit according to claim 17, wherein the data output section is composed of a number of data output units provided so as to correspond to the data signal channels, respectively, each of the data output units being made up of a flip-flop circuit operable in response to the selected clock signal.

19. A parallel signal automatic phase adjusting circuit according to claim 16, wherein the inter-data phase adjusting circuit is arranged to include a clock selecting circuit for selecting a clock signal having the most delayed timing from clock signals having undergone adjustment in the respective adjusting circuits, and for generating a data signal corresponding to the selected clock signal, a data output section for generating all of the data signals at the same timing based on the clock signal selected by the clock selecting circuit, and a register circuit section capable of compensating for a phase deviation exceeding one time slot amount based on bit information of respective data signals.

20. A parallel signal automatic phase adjusting circuit according to claim 19, wherein the register circuit section is arranged to include a plurality of shift registers connected in a cascade fashion so as to correspond to respective data signal channels, each of the shift registers being capable of holding data of corresponding data signal channel, and selectors provided so as to correspond to respective data signal channels so that each selector is supplied with an output signal from the shift registers in the corresponding data signal channel, all of the selectors being capable of outputting respective data stream at the same timing in response to a select signal useful for extracting data pieces having the same timing.

21. A parallel signal automatic phase adjusting circuit according to claim 15, wherein each of the adjusting circuits is arranged to include a temperature sensor for compensating for the temperature dependability of the phase comparing information.

* * * * *